(12) United States Patent
Kim

(10) Patent No.: US 9,520,359 B2
(45) Date of Patent: Dec. 13, 2016

(54) SEMICONDUCTOR DEVICE, DISPLAY DRIVER INTEGRATED CIRCUIT INCLUDING THE DEVICE, AND DISPLAY DEVICE INCLUDING THE DEVICE

(71) Applicant: SAMSUNG ELECTRONICS CO., LTD., Suwon-si, Gyeonggi-do (KR)

(72) Inventor: Myoung-Soo Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/815,752

(22) Filed: Jul. 31, 2015

(65) Prior Publication Data

US 2016/0125833 A1 May 5, 2016

(30) Foreign Application Priority Data

Oct. 30, 2014 (KR) ........................ 10-2014-0149330

(51) Int. Cl.
*H01L 23/528* (2006.01)
*H01L 23/522* (2006.01)

(52) U.S. Cl.
CPC ......... *H01L 23/528* (2013.01); *H01L 23/5226* (2013.01); *H01L 2924/0002* (2013.01)

(58) Field of Classification Search
CPC ................ H01L 2924/00; H01L 2225/06541; H01L 23/481; H01L 23/5226; H01L 25/0657; H01L 27/14636; H01L 27/10855; H01L 27/76898
See application file for complete search history.

(56) References Cited

U.S. PATENT DOCUMENTS 5,591,673 A 1/1997 Chao et al.
5,891,799 A 4/1999 Tsui
(Continued)

FOREIGN PATENT DOCUMENTS

JP 2006-049759 2/2006
KR 10-1999-0024588 A 4/1999
(Continued)

OTHER PUBLICATIONS

Korean Office Action Dated April 1, 2016 Corresponding to Korean Application No. 14-149330.
(Continued)

*Primary Examiner* — Stephen Sherman
(74) *Attorney, Agent, or Firm* — Volentine & Whitt, PLLC

(57) ABSTRACT

A semiconductor device, which may be included in a display driver integrated circuit (IC) and a display device, includes a first interconnection and a second interconnection extending on a substrate and separate from each other, a third interconnection extending at a first level that is higher than a level at which the first interconnection and the second interconnection are disposed, and a fourth interconnection extending at a second level that is higher than the first level. A first contact plug is configured to connect the first interconnection and the third interconnection to each other. A stacked contact plug includes a second contact plug and a third contact plug, wherein the second contact plug is connected to the second interconnection, and the third contact plug is connected to the second contact plug and the fourth interconnection.

18 Claims, 20 Drawing Sheets

(56) References Cited

U.S. PATENT DOCUMENTS

| | | |
|---|---|---|
| 6,225,211 B1 | 5/2001 | Tsui |
| 6,348,408 B1 | 2/2002 | Kasai |
| 6,352,916 B1 | 3/2002 | Tang et al. |
| 6,849,923 B2 | 2/2005 | Seta et al. |
| 6,876,565 B2 | 4/2005 | Meguro et al. |
| 7,084,055 B2 | 8/2006 | Fujiwara et al. |
| 7,169,697 B2 | 1/2007 | Seta et al. |
| 7,299,443 B2 | 11/2007 | Kumagi |
| 7,741,717 B2 | 6/2010 | Hong et al. |
| 8,270,212 B2 | 9/2012 | Izumi et al. |
| 2002/0056919 A1 | 5/2002 | Kasai |
| 2003/0094634 A1* | 5/2003 | Cho ............... H01L 23/585 257/212 |
| 2004/0227212 A1 | 11/2004 | Goller |
| 2005/0041405 A1 | 2/2005 | Kawagoe |
| 2005/0093043 A1* | 5/2005 | Morita ............... G11C 13/0004 257/295 |
| 2007/0001975 A1* | 1/2007 | Kumagai ............... G09G 3/20 345/98 |
| 2008/0032480 A1 | 2/2008 | Gonzalez et al. |
| 2008/0057615 A1* | 3/2008 | Okagawa ......... H01L 27/14603 438/73 |
| 2009/0230562 A1* | 9/2009 | Kondou ............... H01L 23/522 257/774 |
| 2011/0041330 A1 | 2/2011 | Kumar et al. |
| 2012/0139058 A1* | 6/2012 | Yang ............... H01L 29/0692 257/401 |
| 2014/0028325 A1 | 1/2014 | Bonilla et al. |
| 2015/0200134 A1* | 7/2015 | Yang ............... H01L 21/76877 257/371 |

FOREIGN PATENT DOCUMENTS

| | | |
|---|---|---|
| KR | 10-2001-0059161 A | 7/2001 |
| KR | 10-2001-0061788 A | 7/2001 |
| KR | 100377370 | 3/2003 |
| KR | 1020030056157 | 7/2003 |
| KR | 10-2009-0096864 A | 9/2009 |

OTHER PUBLICATIONS

Korean Notice of Allowance Dated Oct. 20, 2016 in Corresponding Application No. KR 10-2014-0149330.

* cited by examiner

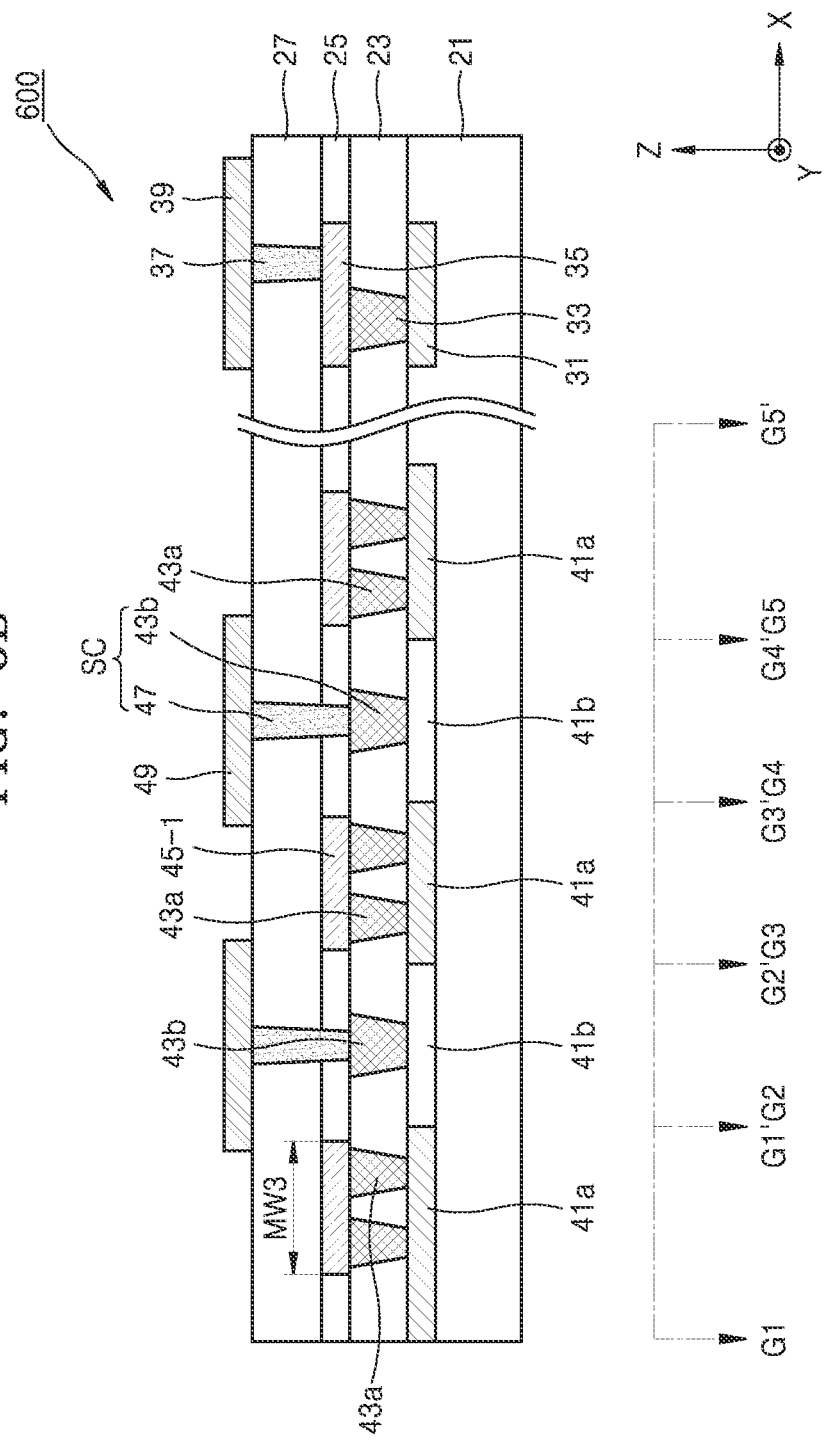

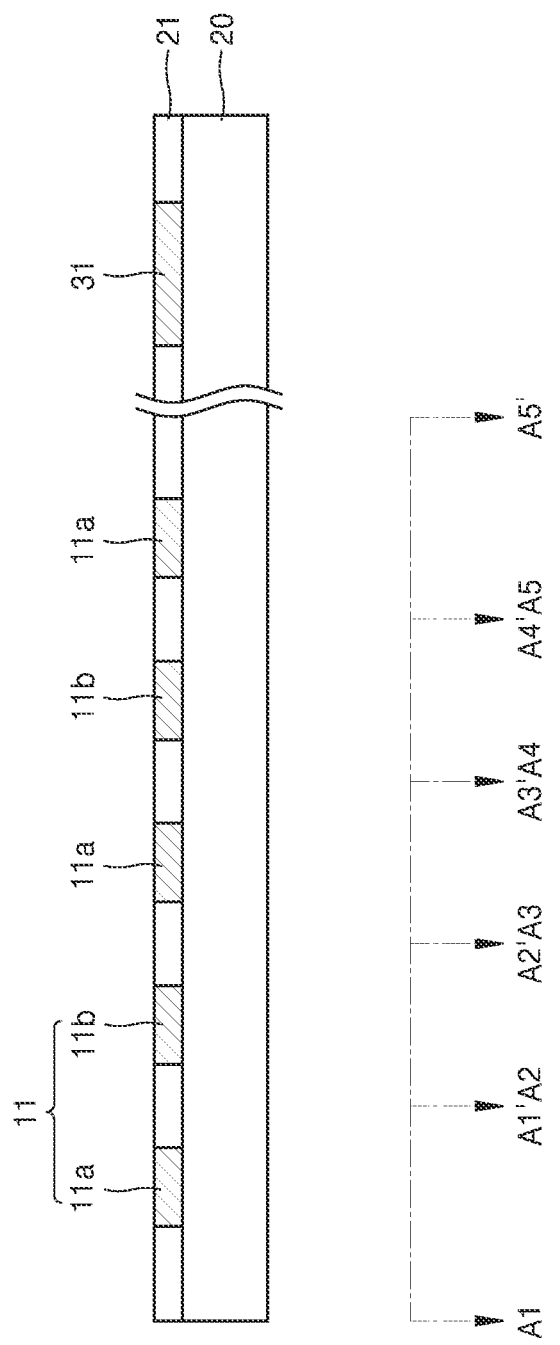

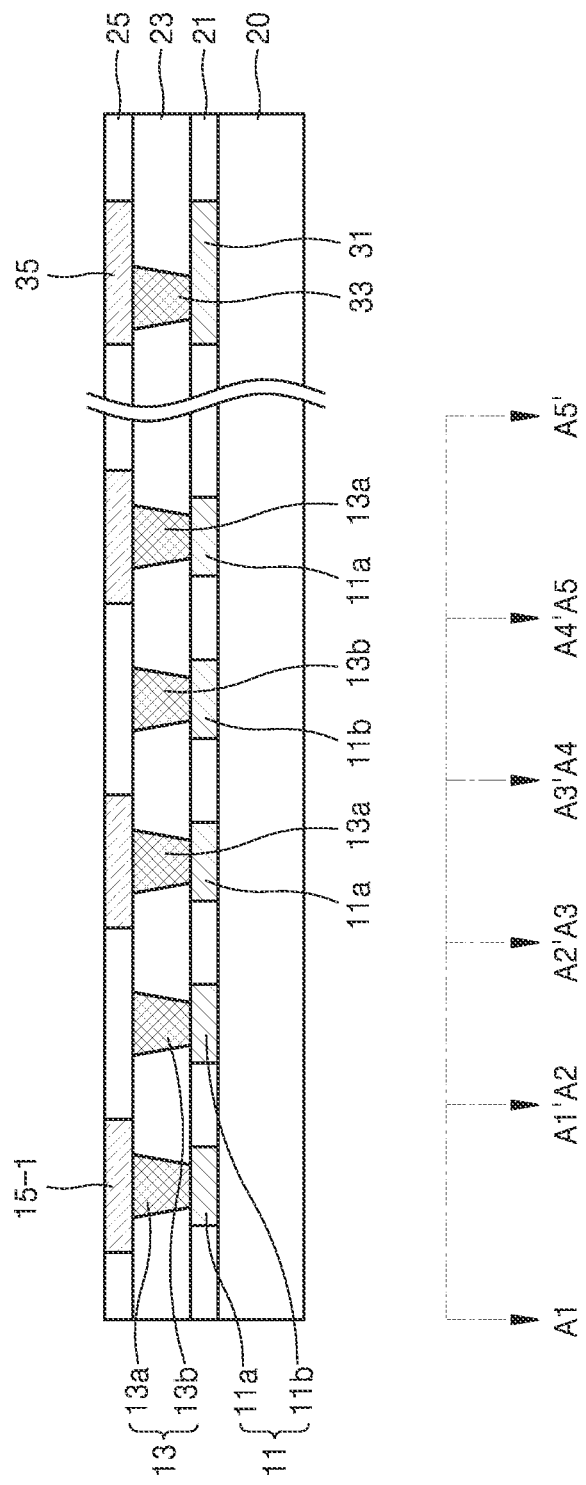

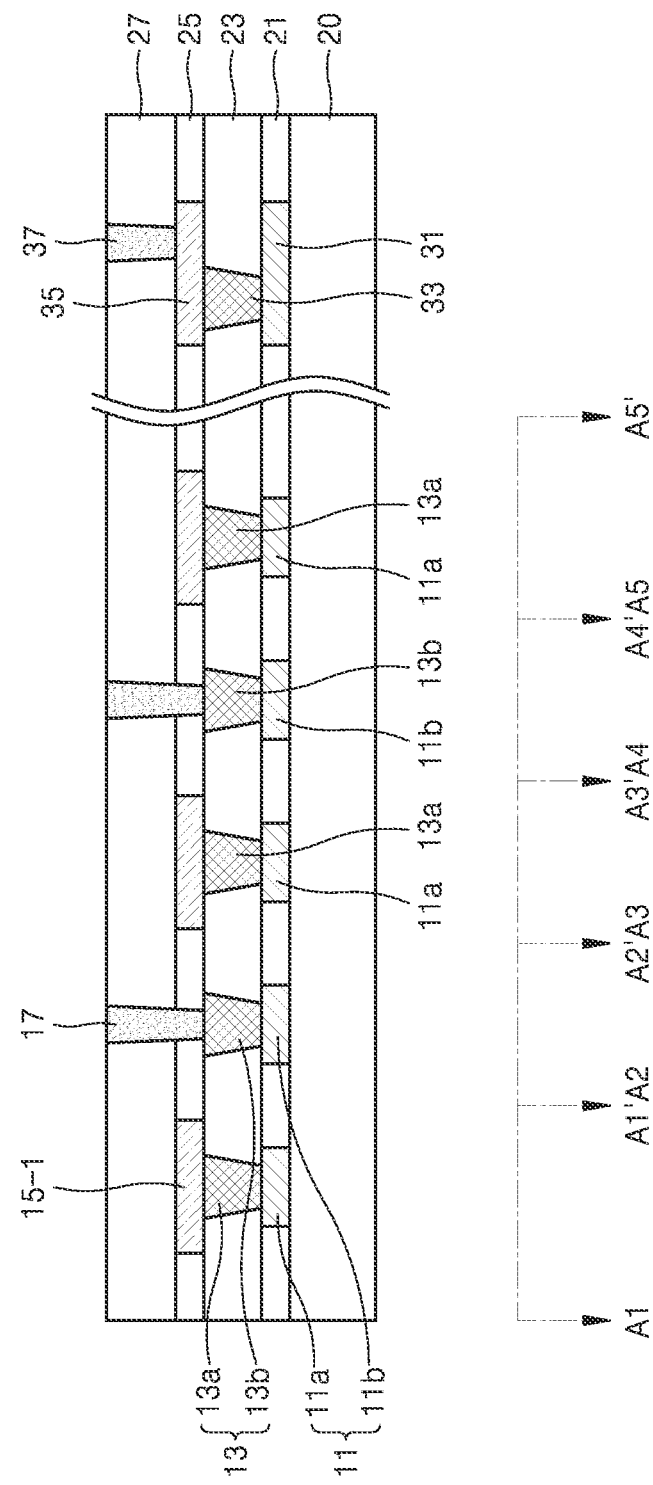

SEMICONDUCTOR DEVICE, DISPLAY DRIVER INTEGRATED CIRCUIT INCLUDING THE DEVICE, AND DISPLAY DEVICE INCLUDING THE DEVICE

CROSS-REFERENCE TO RELATED APPLICATION

A claim for priority under 35 U.S.C. §119 is made to Korean Patent Application No. 10-2014-0149330, filed on Oct. 30, 2014, in the Korean Intellectual Property Office, the disclosure of which is incorporated herein in its entirety by reference.

BACKGROUND

The inventive concepts herein relate to a semiconductor device, a display driver integrated circuit (IC) including the semiconductor device, and a display device including the semiconductor device, and more particularly, to a semiconductor device including an interconnection structure, a display driver IC including the semiconductor device, and a display device including the semiconductor device.

As the integration density of semiconductor devices has increased, design rules for elements of semiconductor devices have been reduced. As a result, distances between a interconnection lines, and contact plugs interposed between the interconnection lines, have gradually been reduced in highly downscaled semiconductor devices. However, since the interconnection lines need to be spaced by a predetermined distance or more apart from one another due to difficulties in processing, as the number of interconnection lines increases it has become more difficult to downscale semiconductor devices. Also, reducing the width of interconnection lines in an effort to downscale semiconductor devices may lead to an increase in interconnection resistance, thereby deteriorating performance of the semiconductor devices. Accordingly, a semiconductor device having a structure capable of solving the above-described problems is needed.

SUMMARY

Embodiments of the inventive concept provide a semiconductor device having an interconnection layout capable of increasing integration density.

Also, embodiments of the inventive concept provide a display device IC and a display device, which have reduced volume and improved performance by applying an interconnection layout having increased integration density to the display driver IC.

Embodiments of the inventive concept provide a semiconductor device including a first interconnection and a second interconnection extending on a substrate and spaced apart from each other, a third interconnection extending on a first planar surface at a first level that is higher than a level at which the first interconnection and the second interconnection are disposed, and a fourth interconnection extending on a second planar surface at a second level that is higher than the first level. The semiconductor device includes a first contact plug configured to connect the first interconnection and the third interconnection to each other, and a stacked contact plug including a second contact plug and a third contact plug. The second contact plug is connected to the second interconnection, and the third contact plug is connected to the second contact plug and the fourth interconnection.

In various embodiments, a first width of the second contact plug is greater than a second width of the third contact plug.

In various embodiments, widths of the third interconnection and the fourth interconnection are greater than widths of the first interconnection and the second interconnection.

In various embodiments, a portion of the third interconnection overlaps a portion of the fourth interconnection in a direction perpendicular to a main surface of the substrate.

In various embodiments, the third interconnection has varying width. A first width of a region of the third interconnection that is adjacent to the stacked contact plug is less than a second width of a region of the third interconnection that is not adjacent to the stacked contact plug.

In various embodiments, a plurality of third interconnections extend on the first planar surface and a plurality of fourth interconnections extend on the second planar surface. The third and fourth interconnections are disposed alternately with respect to each other.

In various embodiments, a plurality of stacked contact plugs are disposed between the third interconnections.

In various embodiments, a first distance between the stacked contact plug and a third interconnection from among the plurality of third interconnections adjacent to a first side of the stacked contact plug is substantially equal to a second distance between the stacked contact plug and another third interconnection from among the plurality of third interconnections adjacent to a second side of the stacked contact plug.

In various embodiments, the semiconductor device further includes a plurality of first contact plugs connecting the first interconnection to the third interconnection.

In various embodiments, the semiconductor device further a plurality of stacked contact plugs connecting the second interconnection to the fourth interconnection.

In various embodiments, the first interconnection, the second interconnection, the third interconnection, and the fourth interconnection may extend parallel with respect to each other.

In various embodiments, the first interconnection and the second interconnection extend parallel with respect to each other in a first direction, and the third interconnection and the fourth interconnection extend parallel with respect to each other in a second direction that is different from the first direction.

In various embodiments, the semiconductor device includes a plurality of first contact plugs connecting the first interconnection to the third interconnection, and the plurality of first contact plugs are disposed parallel with respect to each other along the first direction.

In various embodiments, a first height of the first contact plug is substantially equal to a second height of the second contact plug.

In various embodiments, each of the third interconnection and the fourth interconnection have a stack structure of a plurality of different metal materials.

In various embodiments, the first interconnection is disposed at the same level as the second interconnection.

In various embodiments, the third interconnection has uniform width.

Embodiments of the inventive concept provide a display driver integrated circuit (IC) including a gamma circuit configured to generate a plurality of gamma voltages, and a source driver including a plurality of decoders configured to select and output any one of the plurality of gamma voltages generated by the gamma circuit through a plurality of third interconnections and a plurality of fourth interconnections.

The plurality of third interconnections extend over a substrate at a first level and are respectively connected to a plurality of first interconnections disposed at a lower level than the first level by a plurality of first contact plugs. The plurality of fourth interconnections extend over the substrate at a second level that is higher than the first level. The plurality of fourth interconnections are respectively connected to a plurality of second interconnections disposed at a lower level than the first level by stacked contact plugs including a plurality of second contact plugs and a plurality of third contact plugs. The plurality of second contact plugs are respectively connected to the plurality of fourth interconnections, and the plurality of third contact plugs are respectively connected to the plurality of second contact plugs. The plurality of third interconnections and the plurality of fourth interconnections are alternately disposed with respect to each other.

In various embodiments, different voltages are respectively applied to the plurality of third interconnections and the plurality of fourth interconnections.

Embodiments of the inventive concept provide a semiconductor device including a plurality of first and second interconnections disposed over a substrate, a plurality of third interconnections disposed at a first level above the plurality of first interconnections, and a plurality of fourth interconnections disposed at a second level above the first level. The first interconnections and the third interconnections are connected to each other by first contact plugs, and the second interconnections and the fourth interconnections are connected to each other by stacked contact plugs. The third and fourth interconnections are disposed alternately with respect to each other, and widths of the third and fourth interconnections are greater than widths of the first and second interconnections.

In various embodiments, each of the stacked contact plugs includes a second contact plug connected to a second interconnection from among the plurality of second interconnections, and a third contact plug connected to the second contact plug and a fourth interconnection from among the plurality of fourth interconnections.

In various embodiments, the fourth interconnections overlap the third interconnections in a direction perpendicular to a main surface of the substrate.

In various embodiments, the stacked contact plugs are disposed between adjacent ones of the third interconnections, and the third interconnections have varying width. A first width of regions of the third interconnections that are adjacent to the stacked contact plugs is less than a second width of regions of the third interconnections that are not adjacent to the stacked contact plugs.

Embodiments of the inventive concept provide a display panel including a display driver IC including a source driver configured to select and output any one of a plurality of gamma voltages transmitted by a gamma circuit through a plurality of third interconnections and a plurality of fourth interconnections, an application processor (AC) configured to control the display driver IC, and a display panel configured to output images using signals corresponding to the gamma voltage output by the display driver IC. The plurality of third interconnections extend on a substrate at a first level. The plurality of fourth interconnections and the plurality of third interconnections are disposed alternately with respect to each other. The plurality of fourth interconnections extend at a second level that is higher than the first level, and are respectively connected to a plurality of second interconnections formed at a lower level than the first level by stacked contact plugs including a plurality of second contact plugs and a plurality of third contact plugs. The plurality of second contact plugs are respectively connected to the plurality of second interconnections, and the plurality of third contact plugs are respectively connected to the plurality of second contact plugs and the plurality of fourth interconnections.

BRIEF DESCRIPTION OF THE DRAWINGS

Exemplary embodiments of the inventive concept will be more apparent from the following detailed description taken in conjunction with the accompanying drawings, in which:

FIG. 6B is a cross-sectional view of elements of the semiconductor device of FIG. 6A, according to various embodiments of the inventive concept;

FIGS. 8A, 8B, 8C and 8D are cross-sectional views of sequential processes of a method of manufacturing a semiconductor device, according to various embodiments of the inventive concept;

DETAILED DESCRIPTION OF THE EMBODIMENTS

Figure 1A:
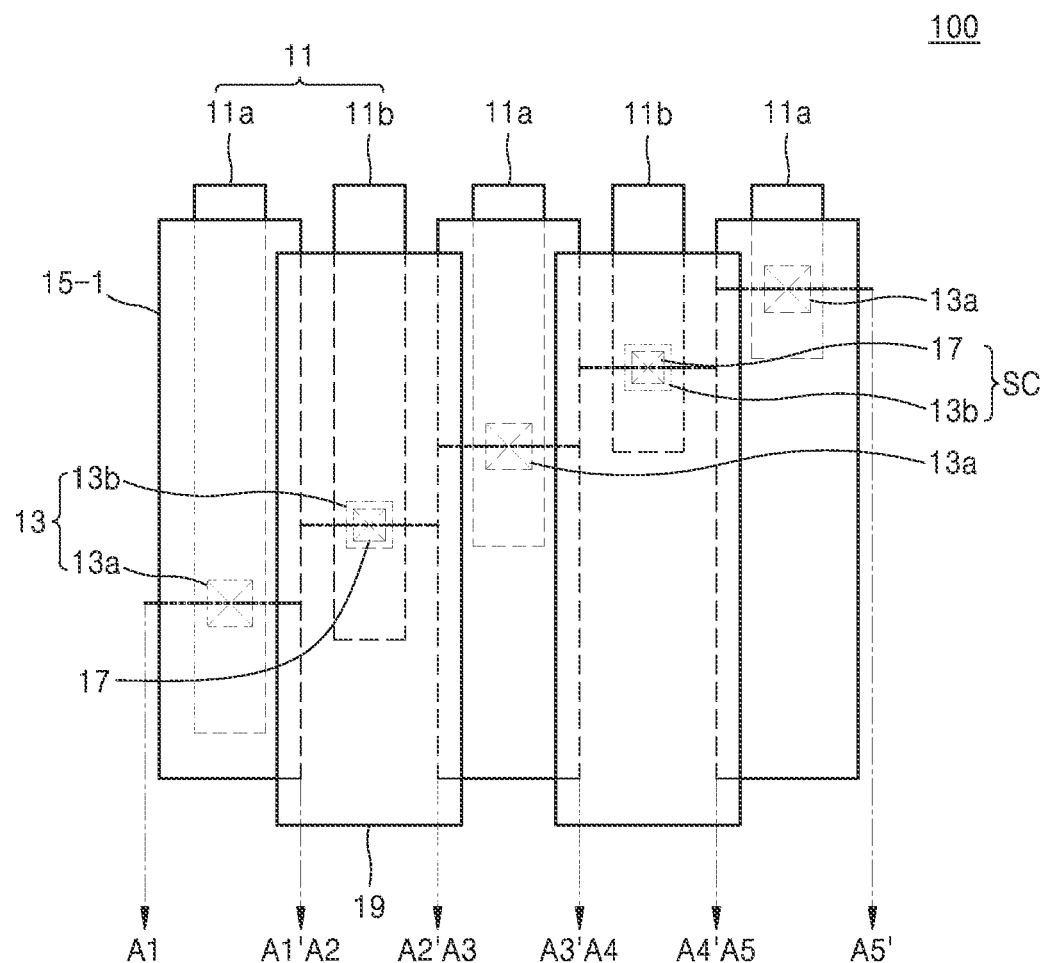
FIG. 1A is a schematic plan layout of a semiconductor device according to various embodiments of the inventive concept.

Embodiments will be described in detail with reference to the following description and accompanying drawings. The inventive concept may, however, be embodied in various different forms, and should not be construed as being limited to the illustrated embodiments. Rather, these embodiments are provided as examples so that this disclosure will be thorough and complete, and will fully convey the inventive concept to one of ordinary skill in the art. Unless otherwise noted, like reference numerals denote like elements throughout the attached drawings and written description, and thus descriptions may not be repeated.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

While some embodiments may be embodied otherwise, respective process steps described herein may also be performed otherwise. For example, two process steps described in a sequential order may be performed at substantially the same time or in reverse order, unless explicitly stated otherwise.

Variations from the shapes of the illustrations as a result of, for example, manufacturing techniques and/or tolerances, are to be expected. Thus, embodiments of the inventive concept should not be construed as limited to the particular shapes of regions illustrated herein but are to include deviations in shapes that result, for example, from manufacturing.

FIG. 1A is a schematic plan layout of a semiconductor device 100 according to various embodiments of the inventive concept.

Referring to FIG. 1A, first interconnections 11a and second interconnections 11b disposed on a substrate (not shown) extend in the same direction and are alternately formed. The first interconnections 11a are connected to third interconnections 15-1 by first contact plugs 13a, respectively. The second interconnections 11b are connected to fourth interconnections 19 by stacked contact plugs SC, each of which includes a second contact plug 13b connected to a top surface of the second interconnection 11b and a third contact plug 17 connected to a top surface of the second contact plug 13b. First interconnections 11a and second interconnections 11b may hereinafter be referred to as base interconnections 11. Also, first and second contact plugs 13a and 13b may hereinafter be referred to as contact plugs 13.

The first interconnections 11a, the second interconnections 11b, the third interconnections 15-1, and the fourth interconnections 19 in FIG. 1A extend in parallel with respect to each other, but the inventive concept is not limited thereto. In various embodiments, the first interconnections 11a and the second interconnections 11b may extend in a first direction, and the third interconnections 15-1 and the fourth interconnections 19 may extend in a second direction that is different from the first direction. In various embodiments, the first direction may be perpendicular to the second direction as will be subsequently described with reference to FIG. 6A.

The first interconnections 11a differ from the second interconnections 11b in that the first interconnections 11a are connected to the first contact plugs 13a and the second interconnections 11b are connected to the stack contact plugs SC. Different reference numerals are therefore used to denote the first and second interconnections 11a and 11b for brevity. However, in various embodiments the first interconnections 11a and the second interconnections 11b may not have different structures but may have substantially similar structures.

Figure 1B:
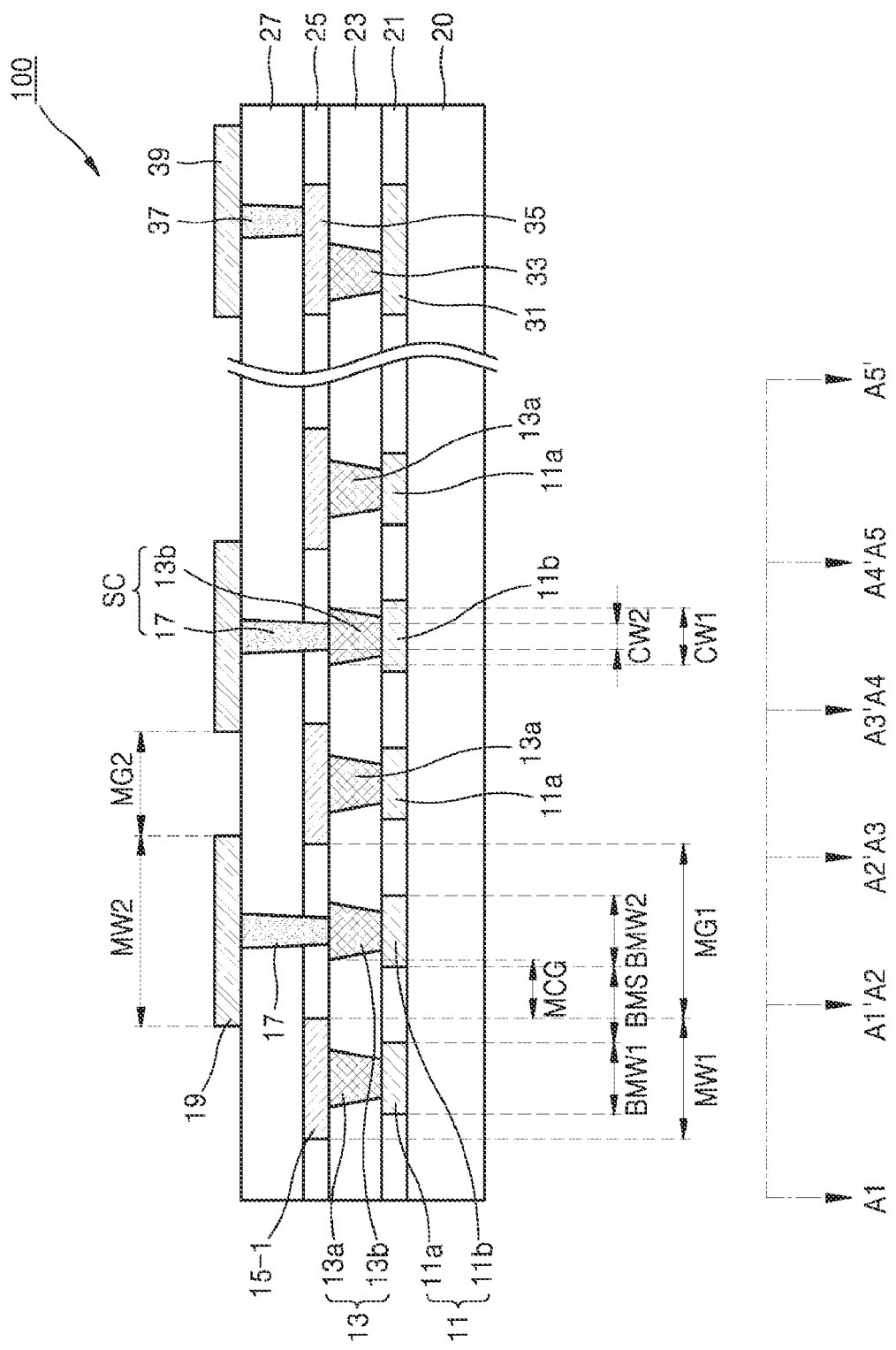
FIG. 1B is a cross-sectional view of elements of the semiconductor device of FIG. 1A, according to various embodiments of the inventive concept.

FIG. 1B is a cross-sectional view of elements of the semiconductor device 100 of FIG. 1A, according to various embodiments of the inventive concept. FIG. 1B shows sequential cross-sectional views of elements of the semiconductor device 100 of FIG. 1A, which are respectively taken along lines A1-A1', A2-A2', A3-A3', A4-A4', and A5-A5', and a cross-sectional view of a peripheral interconnection structure formed at the same level as the elements.

Referring to FIG. 1B, the semiconductor device 100 includes the first interconnections 11a and the second interconnections 11b which extend on a substrate 20 and which are separate from one another, the third interconnections 15-1 which extend on a first planar surface at a first level that is higher than a level at which the first interconnections 11a and the second interconnections 11b are formed, and the fourth interconnections 19 which extend on a second planar surface at a second level that is higher than the first level. Also, the semiconductor device 100 includes the first contact plugs 13a configured to connect the first interconnections 11a and the third interconnections 15-1. The semiconductor device further includes the stacked contact plugs SC including the second contact plugs 13b connected to top surfaces of the second interconnections 11b, and the third contact plugs 17 connected to bottom surfaces of the fourth interconnections 19. Bottom surfaces of third contact plugs 17 are connected to top surfaces of second contact plugs 13b.

Each of the first planar surface and the second planar surface are surfaces that extend over the substrate 20 parallel to a direction in which a main surface of the substrate 20 extends. The first contact plugs 13a, the second contact plugs 13b, and the third contact plugs 17 extend in a direction perpendicular to a direction in which the first planar surface and the second planar surface extend.

The first interconnections 11a and the second interconnections 11b are confined by a first insulating layer 21 formed on the substrate 20. A plurality of first interconnections 11a and a plurality of second interconnections 11b are provided and disposed alternately with respect to each other. However, in various embodiments of the inventive concept some of first interconnections 11a may be disposed next to each other, and some of second interconnections 11b may be disposed next to each other. Although the plurality of first interconnections 11a and the plurality of second interconnections 11b are illustrated as being at the same level from the substrate 20, in various embodiments the first interconnections 11a and the second interconnections 11b may be formed at respectively different levels on the substrate 20. Also, although a width BMW1 of the first interconnections 11a shown in FIG. 1B is substantially equal to a width BMW2 of the second interconnections 11b, in various embodiments of the inventive concept width BMW1 may be different than width BMW2.

The semiconductor device 100 may further include a peripheral interconnection structure in addition to the interconnection structure shown in cross-sectional views taken along lines A1-A1', A2-A2', A3-A3', A4-A4', and A5-A5'. A first peripheral interconnection 31 included in the peripheral interconnection structure is formed at the same level as a base interconnection 11 and is confined by the first insulating layer 21. A fourth contact plug 33 formed on the first peripheral interconnection 31 is formed at the same level as the first and second contact plugs 13a and 13b, and penetrates a second insulating layer 23. A second peripheral interconnection 35 formed on the fourth contact plug 33 is formed at the same level as the third interconnection 15-1 and is confined by a third insulating layer 25. A fifth contact plug 37 formed on the second peripheral interconnection 35 may be formed at the same time as the third contact plug 17 by using a process used to form the third contact plug 17. The fifth contact plug penetrates a fourth insulating layer 27. A third peripheral interconnection 39 is connected to the fifth contact plug 37. The peripheral interconnection structure shown in FIG. 1B may be an example of a peripheral interconnection structure that may be included in a semiconductor device including a typical interconnection structure. However, in various embodiments of the inventive concept, different peripheral interconnection structures may be included in the semiconductor device 100.

The first interconnection 11a and the second interconnection 11b are maintained separate from each other by a predetermined distance BMS so that the occurrence of failures may be prevented during a process of forming interconnections or during actual operations of the interconnections. The distance BMS may be adjusted depending on process conditions or process capability.

The first contact plug 13a penetrates the second insulating layer 23 and connects the first interconnection 11a and the third interconnection 15-1 to each other.

The third interconnection 15-1 is confined by the third insulating layer 25 and formed on the first contact plug 13a to be connected to the first contact plug 13a. A width MW1 of the third interconnection 15-1 in FIG. 1B is greater than the width BMW1 of the first interconnection 11a. All base interconnections 11 included in the semiconductor device 100 must be disposed on substrate 20 separate from one another by a distance within a predetermined range. Since the base interconnections 11 need to be separate from one another by the predetermined distance BMS, the widths BMW1 and BMW2 of the first and second interconnections 11a and 11b formed at the same first level may be restricted within a predetermined range. However, the fourth interconnection 19 disposed adjacent to the third interconnection 15-1 is formed at the second level that is higher than the first level at which the third interconnection 15-1 is formed. Thus, the width MW1 of the third interconnection 15-1 is not restricted by adjacent interconnections. That is, the width MW1 of the third interconnection 15-1 is not restricted by adjacent fourth interconnection 19. Since the width MW1 of the third interconnection 15-1 may thus be increased, a resistance of the third interconnection 15-1 may consequently be reduced. Accordingly, the semiconductor device 100 may operate more efficiently. In this case, however, a distance MCG between the third interconnection 15-1 and the stacked contact plug SC disposed adjacent thereto may be restricted within a predetermined range. In various embodiments of the inventive concept, the width MW1 of the third interconnection 15-1 may be about 0.05 μm to about 50 μm. In various embodiments of the inventive concept, the distance MCG between the third interconnection 15-1 and the stacked contact plug SC may be about 0.05 μm to about 50 μm.

The second contact plug 13b penetrates the second insulating layer 23 and connects the second interconnection 11b and the third contact plug 17 to each other. The first contact plug 13a and the second contact plug 13b may be formed by using the same process. Thus, the first contact plug 13a and the second contact plug 13b shown in FIG. 1B are formed to have substantially the same height. In various embodiments of the inventive concept, the height of the first contact plug 13a may however be different than a height of the second contact plug 13b.

The third contact plug 17 is formed to penetrate the third insulating layer 25 and the fourth insulating layer 27, and is connected to a top surface of the second contact plug 13b. Thus, the second contact plug 13b and the third contact plug 17 constitute a stacked contact plug SC. In FIG. 1B, a width CW1 of the top surface of the second contact plug 13b is greater than a width CW2 of a bottom surface of the third contact plug 17, so as to facilitate electrical connection of the third contact plug 17 with the second contact plug 13b. In various embodiments, the width CW1 of the top surface of the second contact plug 13b may range from about 50 nm to about 500 nm. In various embodiments, the width CW1 of the top surface of the second contact plug 13b may be greater by about 1 nm to about 450 nm than the width CW2 of the bottom surface of the third contact plug 17. In various embodiments of the inventive concept, the width CW1 may not be greater than the width CW2.

The fourth interconnection 19 is formed on the fourth insulating layer 27 and connected to the stacked contact plug SC. The fourth interconnection 19 is confined by an insulating layer (not shown). A width MW2 of the fourth interconnection 19 may be greater than a distance MG1 between the third interconnections 15-1. Thus, a portion of the fourth interconnection 19 may overlap a portion of the third interconnection 15-1 in a direction perpendicular to the direction which a main surface of substrate 20 extends. The width MW2 of the fourth interconnection 19 may be greater than the width BMW2 of the second interconnection 11b. As described above, since the third interconnection 15-1 disposed adjacent to the fourth interconnection 19 is formed at the first level that is lower than the second level at which the fourth interconnection 19 is formed, the width MW2 of the fourth interconnection 19 may not be greatly restricted. Since the width MW2 of the fourth interconnection 19 may thus be increased, a resistance of the fourth interconnection 19 may consequently be reduced so that the semiconductor device 100 may operated more efficiently. However, a distance MG2 between the fourth interconnections 19 may be restricted within a predetermined range.

Since a plurality of first interconnections 11a and a plurality of second interconnections 11b are alternately formed with respect to each other, a plurality of third interconnections 15-1 connected to the plurality of first interconnections 11a and a plurality of fourth interconnections 19 connected to the plurality of second interconnections 11b are alternately formed with respect to each other. Thus, the stacked contact plug SC is formed between adjacent third interconnections 15-1. In FIG. 1B, a first distance between the stacked contact plug SC and the third interconnection 15-1 disposed adjacent to a left side of the stacked contact plug SC is substantially equal to a second distance between the stacked contact plug SC and the third interconnection 15-1 disposed adjacent to a right side of the stacked contact plug SC. In various embodiments of the inventive concept, the above mentioned first and second distances may not be equal.

In various embodiments, a plurality of first contact plugs 13a may be used to connect a first interconnection 11a with a third interconnection 15-1. In various embodiments, a plurality of stacked contact plugs SC may be used to connect a second interconnection 11b with a fourth interconnection 19. These various embodiments will be subsequently described in detail with reference to FIGS. 3A to 4.

As described above, widths of interconnections included in the semiconductor device 100 and distances between a plurality of interconnections may directly affect the performance of the semiconductor device 100. When a distance between interconnections is excessively small, after the interconnections are formed using an interconnection material, in some cases portions between the interconnections may not be entirely etched, so that an electric short may occur between the interconnections. In other cases, it may be difficult to fill gaps between the interconnections with the interconnection material, so a process of forming interconnections may be precluded. In these cases, interconnection failures may occur. Also, narrow interconnections are formed and semiconductor devices including the narrow interconnections actually operate, interconnection structures may be changed due to electromigration or stress migration so that electrical failures may occur. Accordingly, due to design restrictions, it may be necessary to form interconnections as having a predetermined width and it may be necessary to maintain a predetermined distance between the interconnections. In particular, when a very large number of interconnections are required as in, for example, a display driver IC (DDI), as the number of interconnections is increased, a distance between the interconnections must be maintained within a predetermined range due to design restrictions. Thus, as the number of the interconnections increases, a size of a DDI including the interconnections may also increase. Furthermore, when an interconnection of extended length has a long side much longer than a short side thereof, a resistance of the interconnection may sharply jump. Accordingly, as the number of interconnections increases, it may be difficult to reduce the width of the interconnections.

Therefore, the semiconductor device 100 according to various embodiments of the inventive concept may include an interconnection structure in which a plurality of interconnections may be configured to include the third interconnections 15-1 disposed at a lower level and the fourth interconnections 19 disposed at an upper level, with the fourth interconnections 19 disposed at the upper level connected to the second interconnections 11b by stacked contact plugs. As a result, a distance between interconnections as determined by process capabilities may be maintained and a layout region of the interconnections may be reduced, so that volume of the semiconductor device 100 may be reduced. In addition, since the third interconnections 15-1 and the fourth interconnections 19 may be formed to have greater widths MW1 and MW2, respectively, an interconnection resistance may be reduced, thereby enabling more efficient operation of the semiconductor device 100. Furthermore, the occurrence of an electrical short and gap-fill failures may be prevented. Thus, operating reliability and yield of the semiconductor device 100 may be improved, and design for manufacturing (DFM) may be possible.

The various embodiments of the inventive concept may be effective for semiconductor devices that require very large numbers of interconnections. In various embodiments, the semiconductor device 100 may be used to embody a DDI. The third interconnections 15-1 and the fourth interconnections 19 may be a plurality of interconnections configured to connect a gamma circuit with decoders of a source driver.

The third interconnections 15-1 and the fourth interconnections 19 may include a conductive material. In various embodiments, the third interconnections 15-1 and the fourth interconnections 19 may include at least one metal material. The third interconnections 15-1 and the fourth interconnections 19 may include the same material. In various embodiments, the third interconnections 15-1, the fourth interconnections 19, the first contact plugs 13a, the second contact plugs 13b, and the third contact plugs 17 may include the same material.

In various embodiments, each of the third interconnections 15-1 and the fourth interconnections 19 may have a stack structure including a plurality of different metal materials.

Figure 2A:
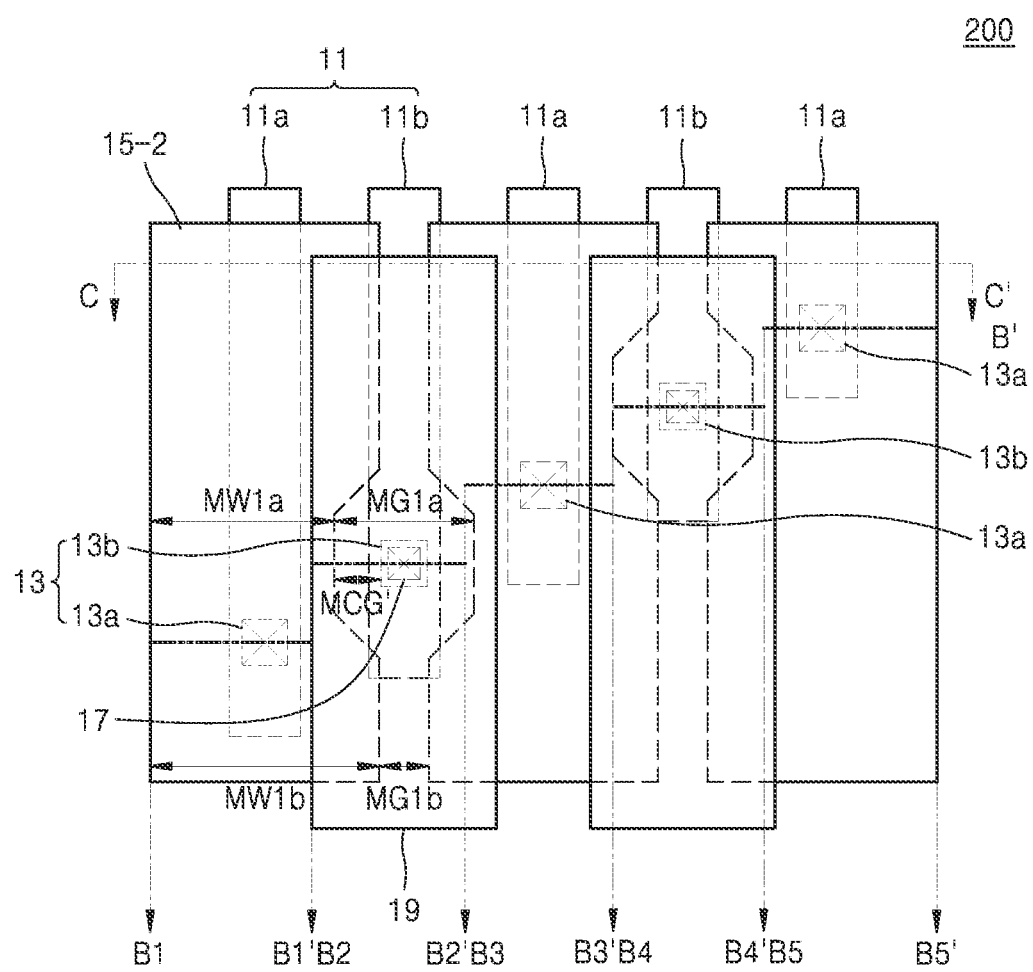
FIG. 2A is a schematic plan layout of a semiconductor device according to various embodiment of the inventive concept.

FIG. 2A is a schematic plan layout of a semiconductor device 200 according to various embodiments of the inventive concept. Some of the same elements as in FIG. 1A are included in FIG. 2A along with the same reference numerals, and repeated descriptions of such similar elements may be omitted from the following description.

Referring to FIG. 2A, the semiconductor device 200 is similar to the semiconductor device 100 described with reference to FIGS. 1A and 1B, but is however different from the semiconductor device 100 in terms of the structure of third interconnection 15-2.

First interconnections 11a and second interconnections 11b disposed on a substrate (not shown) extend in the same direction and be alternately formed with respect to each other. The first interconnection 11a is connected to a third interconnection 15-2 by a first contact plug 13a. The second interconnection 11b is connected to a fourth interconnection 19 by a stacked contact plug SC including a second contact plug 13b connected to a top surface of the second interconnection 11b, and a third contact plug 17 connected to a top surface of the second contact plug 13b. The third interconnection 15-2 and the fourth interconnection 19 extend in the same direction as the first interconnection 11a and the second interconnection 11b.

A width of the third interconnection 15-2 as shown in FIG. 2A is not constant. A plurality of third interconnections 15-2 are provided which extend in parallel with respect to each other, and the stacked contact plug SC including second contact plug 13b and third contact plug 17 is disposed between the plurality of third interconnections 15-2. In this case, a width MW1a of the third interconnection 15-2 in the region where the third interconnection 15-2 is adjacent to the stacked contact plug SC may be less than a width MW1b of the third interconnection 15-2 in regions where the third interconnection 15-2 is not adjacent to the stacked contact plug SC, so that the third interconnection 15-2 is separate and away from the stacked contact plug SC.

A distance MCG' between the third interconnection 15-2 and the stacked contact plug SC in the region where the third interconnection 15-2 is adjacent to the stacked contact plug SC may be adjusted depending on process conditions to have a length so as to solve design layout restrictions that would otherwise be necessary to avoid the occurrence of an electrical short and gap-fill failures between the interconnections.

A distance MG1a between adjacent third interconnections 15-2 in a region where the third interconnections 15-2 are adjacent to the stacked contact plug SC may be greater than a distance MG1b between adjacent third interconnections 15-2 in regions where the third interconnections 15-2 are not adjacent to the stacked contact plug SC. The distance MG1b between adjacent third interconnections 15-2 in the region where the third interconnections 15-2 are not adjacent to the stacked contact plug SC may be adjusted depending on process conditions to have a length so as to solve design layout restrictions that would otherwise be necessary to avoid the occurrence of an electrical short and gap-fill failures between the interconnections.

In various embodiments, the distance MCG' between the third interconnection 15-2 and the stacked contact plug SC in the region where the third interconnection 15-2 is adjacent to the stacked contact plug SC may be substantially equal to the distance MG1b between the adjacent third interconnections 15-2 in regions where the third interconnections 15-2 are not adjacent to the stacked contact plug SC. Accordingly, conductive elements including the stacked contact plugs SC and the third interconnections 15-2 may be formed a predetermined distance apart from one another. The distance MCG' between the third interconnection 15-2 and the stacked contact plug SC, and the distance MG1b between the adjacent third interconnections 15-2 which is substantially equal to distance MCG' in this case, may be adjusted depending on process conditions to have a length so as to solve design layout restrictions that would otherwise be necessary to avoid the occurrence of an electrical short and gap-fill failures between the interconnections.

Figure 2B:
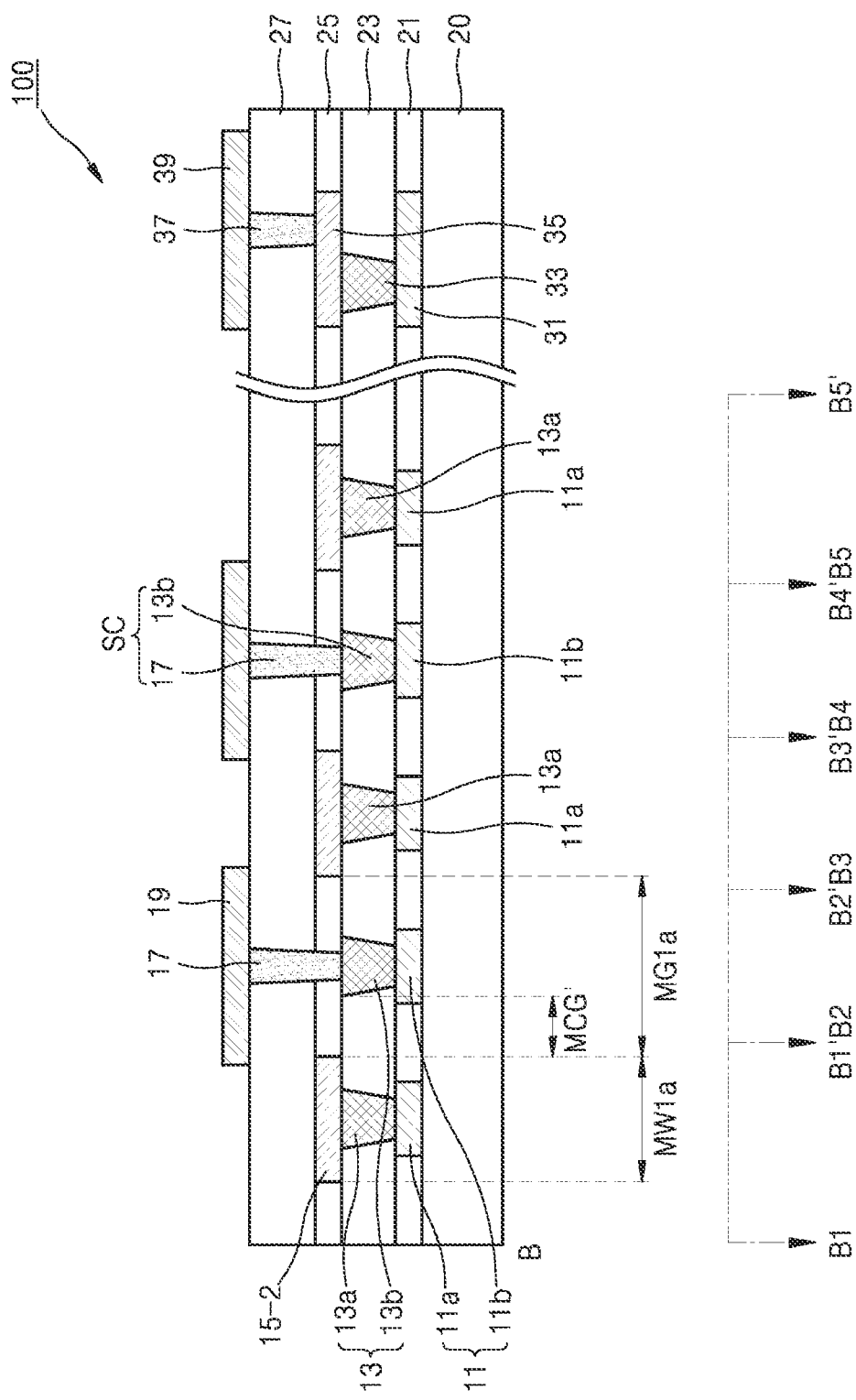
FIGS. 2B and 2C are cross-sectional views of elements of the semiconductor device of FIG. 2A, according to various embodiments of the inventive concept.
Figure 2C:
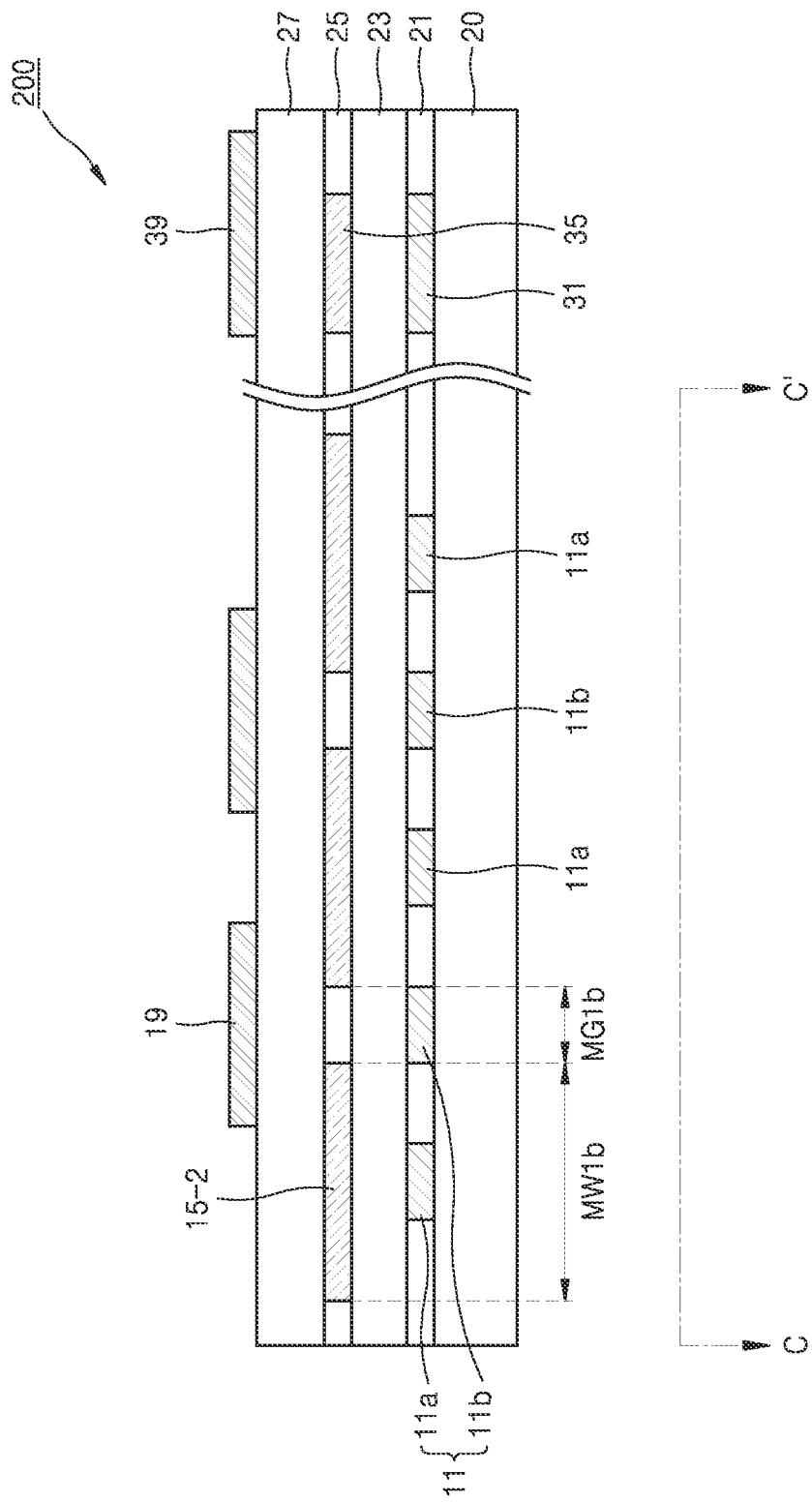

FIGS. 2B and 2C are cross-sectional views of elements of the semiconductor device 200 of FIG. 2A, according to various embodiments of the inventive concept. FIG. 2B shows sequential cross-sectional views of elements of the semiconductor device 200 of FIG. 2A, which are respectively taken along lines B1-B1', B2-B2', B3-B3', B4-B4', and B5-B5', and a cross-sectional view of a peripheral interconnection structure formed at the same level as the elements. FIG. 2C shows a cross-sectional view of elements of the semiconductor device 200 of FIG. 2A taken along a line C-C', and a peripheral interconnection structure formed at the same level as the elements.

FIG. 2B shows a cross-sectional view taken in the region where the third interconnection 15-2 is adjacent to the stacked contact plug SC, and FIG. 2C shows a cross-sectional view taken in a region where the third interconnection 15-2 is not adjacent to the stacked contact plug SC. The width MW1a (refer to FIG. 2B) of the third interconnection 15-2 in the region where the third interconnection 15-2 is adjacent to the stacked contact plug SC is less than the width MW1b (refer to FIG. 2C) of the third interconnection 15-2 in a region where the third interconnection 15-2 is not adjacent to the stacked contact plug SC.

Thus, the distance MG1a (refer to FIG. 2B) between adjacent third interconnections 15-2 in the region where the third interconnections 15-2 are adjacent to the stacked contact plug SC is greater than the distance MG1b (refer to FIG. 2C) between the third interconnections 15-2 in a region where the third interconnections 15-2 are not adjacent to the stacked contact plug SC.

The distance MCG' (refer to FIG. 2B) between the third interconnection 15-2 and the stacked contact plug SC in the region where the third interconnection 15-2 is adjacent to the stacked contact plug SC may be substantially similar to the distance MG1b (refer to FIG. 2C) between the adjacent third interconnections 15-2 in a region where the third interconnections 15-2 are not adjacent to the stacked contact plug SC.

The first contact plug 13a and the stacked contact plug SC shown in FIGS. 2A and 2B are not illustrated in FIG. 2C, because FIG. 2C is not taken along a line passing through the first contact plug 13a and the stacked contact plug SC. FIG. 2C is a cross-sectional view of base interconnections 11, the third interconnections 15-2, and fourth interconnections 19 that extend in a predetermined direction. Also, FIG. 2C shows a cross-sectional view of an example of a peripheral interconnection structure such as described with respect to FIG. 1B. Although contact plugs are not shown in the peripheral interconnection structure of FIG. 2C, various other embodiments of the inventive concept are not limited as not having contact plugs in the peripheral interconnection structure of FIG. 2C. The first contact plugs 13a and the stacked contact plugs SC such as shown in FIG. 2B may not be similar to contact plugs of the peripheral interconnection structure. Moreover, in various embodiments of the inventive concept, at least one contact plug may be formed in the region along the line C-C' according to a predetermined circuit design.

Figure 3A:
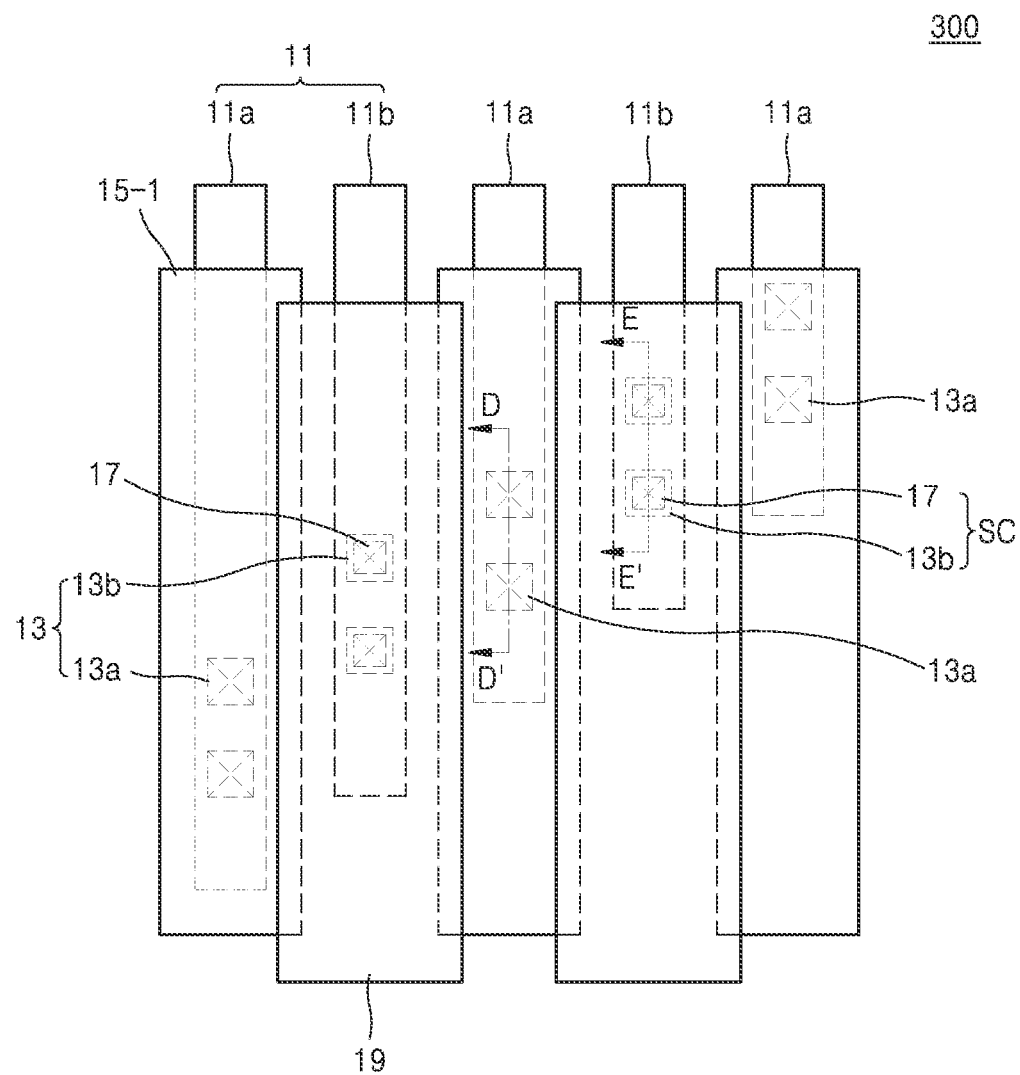
FIG. 3A is a schematic plan layout of a semiconductor device according to various embodiment of the inventive concept.

FIG. 3A is a schematic plan layout of a semiconductor device 300 according to various embodiments of the inventive concept.

Referring to FIG. 3A, the semiconductor device 300 is similar to the semiconductor device 100 described with reference to FIGS. 1A and 1B, but is however different from the semiconductor device 100 in that a plurality of first contact plugs 13a and a plurality of stacked contact plugs SC are formed.

First interconnections 11a and second interconnections 11b disposed on a substrate (not shown) extend in the same direction and are alternately formed with respect to each other. As shown, a first interconnection 11a is connected to a third interconnection 15-1 by two first contact plugs 13a. Also, a second interconnection 11b is connected to a fourth interconnection 19 by two stacked contact plugs SC, each of which may include a second contact plug 13b connected to a top surface of the second interconnection 11b and a third contact plug 17 connected to a top surface of a second contact plug 13b. The third interconnection 15-1 and the fourth interconnection 19 extend in the same direction as the first interconnection 11a and the second interconnection 11b.

As described, the first interconnection 11a and the third interconnection 15-1 are connected by two first contact plugs 13a, although any greater number of first contact plugs 13a may be used. Thus, since the first contact plugs 13a are connected in parallel, a connection resistance between the first interconnection 11a and the third interconnection 15-1 may be reduced. Similarly, since the second interconnection 11b and the fourth interconnection 19 are connected by two stacked contact plugs SC, a connection resistance between the second interconnection 11b and the fourth interconnection 19 may be reduced. Also, in various embodiments any greater number of stacked contact plugs SC may be used to connect the second interconnection 11b and the fourth interconnection 19.

Thus, the semiconductor devices 100, 200, or 300 according to various embodiments of the inventive concept may include at least one first contact plug 13a and at least one stacked contact plug SC connecting interconnections. Although FIG. 3A illustrates the semiconductor device 300 as including two first contact plugs 13a connecting the first interconnection 11a and the third interconnection 15-1, and two stacked contact plugs SC connecting the second interconnection 11b and the fourth interconnection 19, in various embodiments two first contact plugs 13a may be formed connecting the first interconnection 11a and the third interconnection 15-1, and one stacked contact plug SC may be formed connecting the second interconnection 11b and the fourth interconnection 19.

Figure 3B:
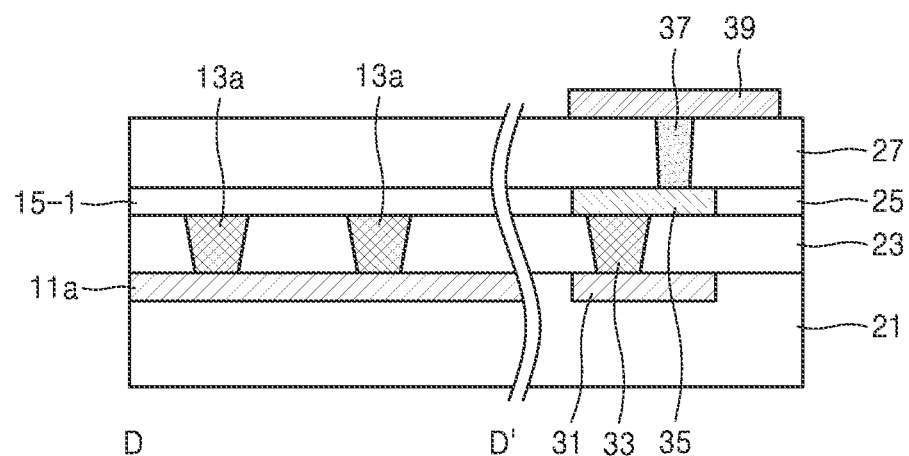
FIGS. 3B and 3C are cross-sectional views of elements of the semiconductor device of FIG. 3A, according to various embodiments of the inventive concept.
Figure 3C:
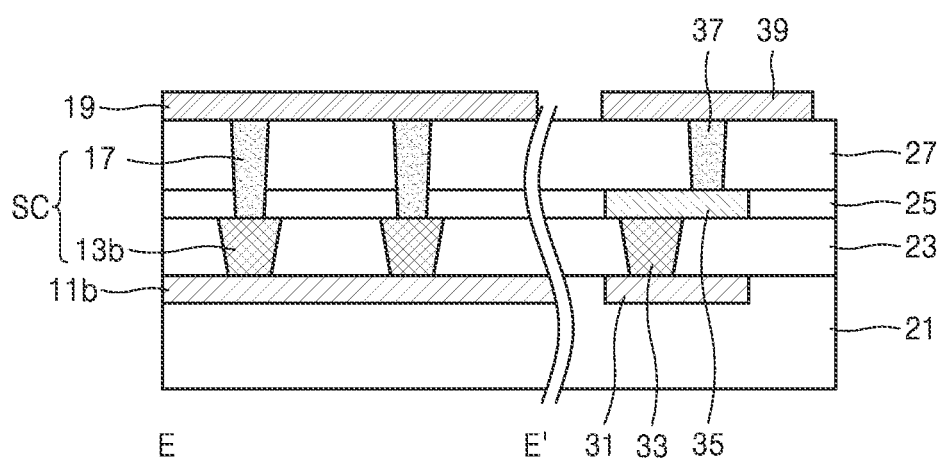

FIGS. 3B and 3C are cross-sectional views of elements of the semiconductor device 300 of FIG. 3A, according to various embodiments of the inventive concept. FIG. 3B illustrates a cross-sectional view of the semiconductor device 300 of FIG. 3A taken along line D-D' of FIG. 3A, and also illustrates a cross-sectional view of a peripheral interconnection structure formed at the same level as the elements of the semiconductor device 300 of FIG. 3A. FIG. 3D illustrates a cross-sectional view of the semiconductor device 300 of FIG. 3A taken along line E-E' of FIG. 3A, and also illustrates a cross-sectional view of a peripheral interconnection structure formed at the same level as the elements of the semiconductor device 300 of FIG. 3A.

Referring to FIGS. 3B and 3C, since the first interconnection 11a and the third interconnection 15-1 may be shared as two nodes between the two first contact plugs 13a, a resistance caused by the first contact plugs 13a may be reduced. Similarly, the second interconnection 11b and the fourth interconnection 19 are connected by two stacked contact plugs SC, and a resistance caused by the stacked contact plugs SC may be reduced as described above.

Figure 4:
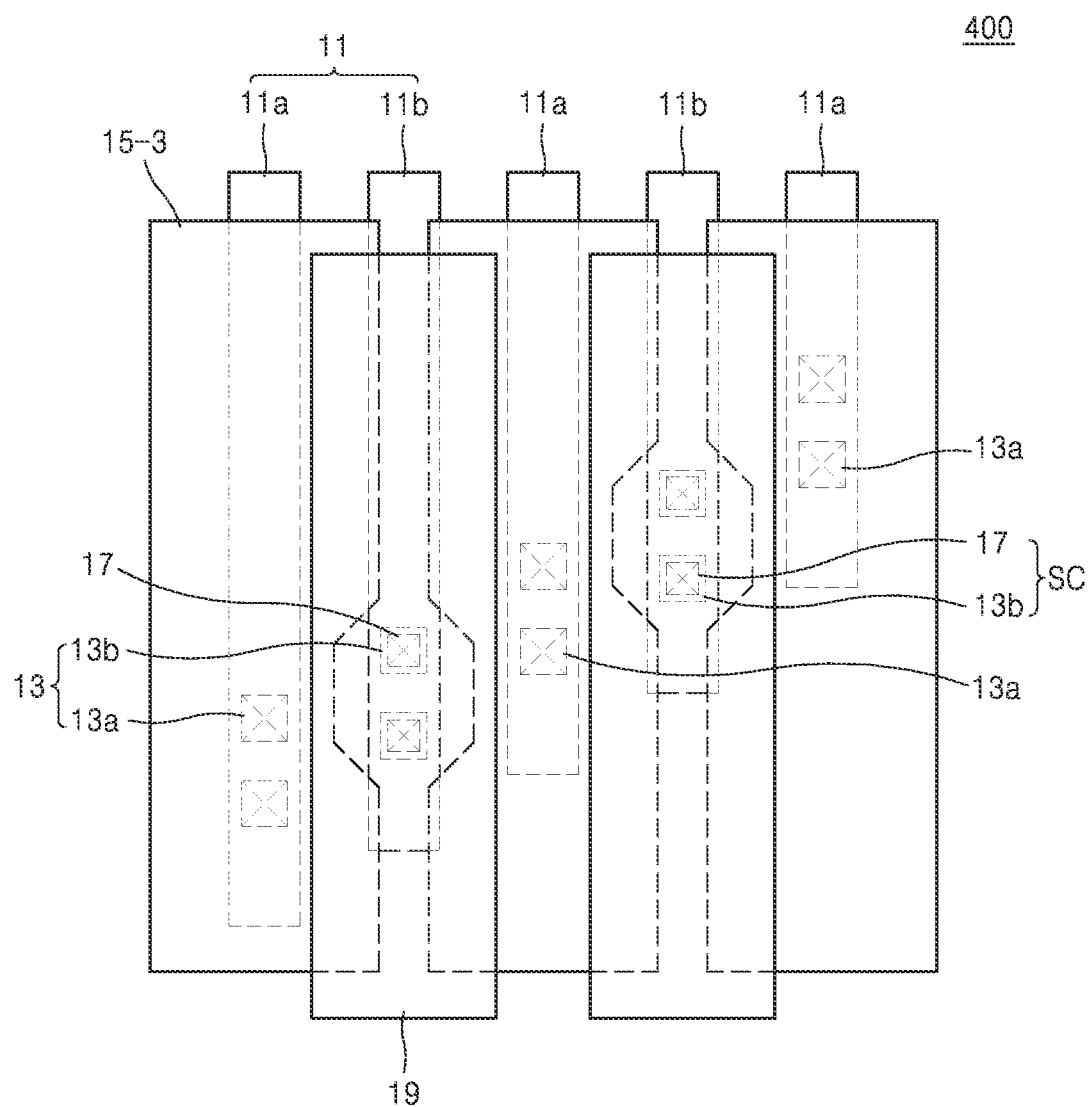
FIG. 4 is a schematic plan layout of a semiconductor device according to various embodiments of the inventive concept.

FIG. 4 is a schematic plan layout of a semiconductor device 400 according to various embodiments of the inventive concept.

Referring to FIG. 4, the semiconductor device 400 is similar to the semiconductor device 100 described with reference to FIGS. 1A and 1B, but is however different in that the semiconductor device 400 includes a plurality of contact plugs 13a and a plurality of stacked contact plugs SC, and a third interconnection 15-3 has a different structure.

In a similar manner as described in detail with reference to FIGS. 3A and 3B, a first interconnection 11a and a third interconnection 15-3 in FIG. 4 are connected by two first contact plugs 13a, and a second interconnection 11b and a fourth interconnection 19 are connected by two stacked contact plugs SC including second contact plug 13b and third contact plug 17, so that connection resistances caused by having only one first contact plug 13a and having only one stacked contact plug SC may be reduced.

A width of the third interconnection 15-3 is not constant. The two stacked contact plugs SC may be disposed between the plurality of third interconnections 15-3, which extend in parallel. In this case, a width of the region of the third interconnection 15-3 that is adjacent to the two stacked contact plugs SC is less than a width of a region of the third interconnection 15-3 that is not adjacent to the two stacked contact plugs SC, so that the third interconnection 15-3 is formed separate and away from the two stacked contact plugs SC.

Figure 5A:
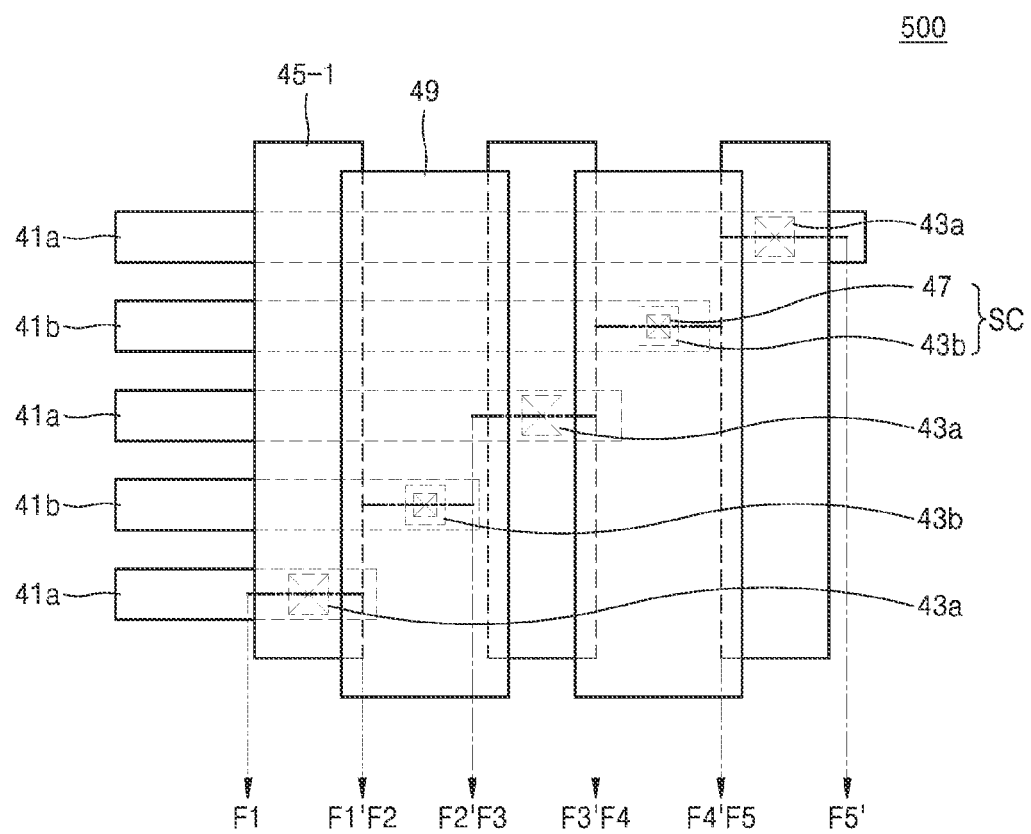
FIG. 5A is a schematic plan layout of a semiconductor device according to various embodiments of the inventive concept.

FIG. 5A is a schematic plan layout of a semiconductor device 500 according to various embodiments of the inventive concept.

Referring to FIG. 5A, the semiconductor device 500 is similar to the semiconductor device 100 described with reference to FIGS. 1A and 1B, but is however different from the semiconductor device 100 in that a direction in which a first interconnection 41a and a second interconnection 41b extend is different from a direction in which a third interconnection 45-1 and a fourth interconnection 49 extend.

First interconnections 41a and second interconnections 41b disposed on a substrate (not shown) extend in parallel in a first direction and are alternately formed with respect to each other. Third interconnections 45-1 and fourth interconnections 49 extend in parallel with respect to each other in a second direction, which is different from the first direction, and are connected to the first interconnections 41a and the second interconnections 41b by first contact plugs 43a and stacked contact plugs SC, respectively. Each of the stacked contact plugs SC include a second contact plug 43b connected to a top surface of the second interconnection 41b and a third contact plug 47 connected to a top surface of the second contact plug 43b.

Figure 5B:
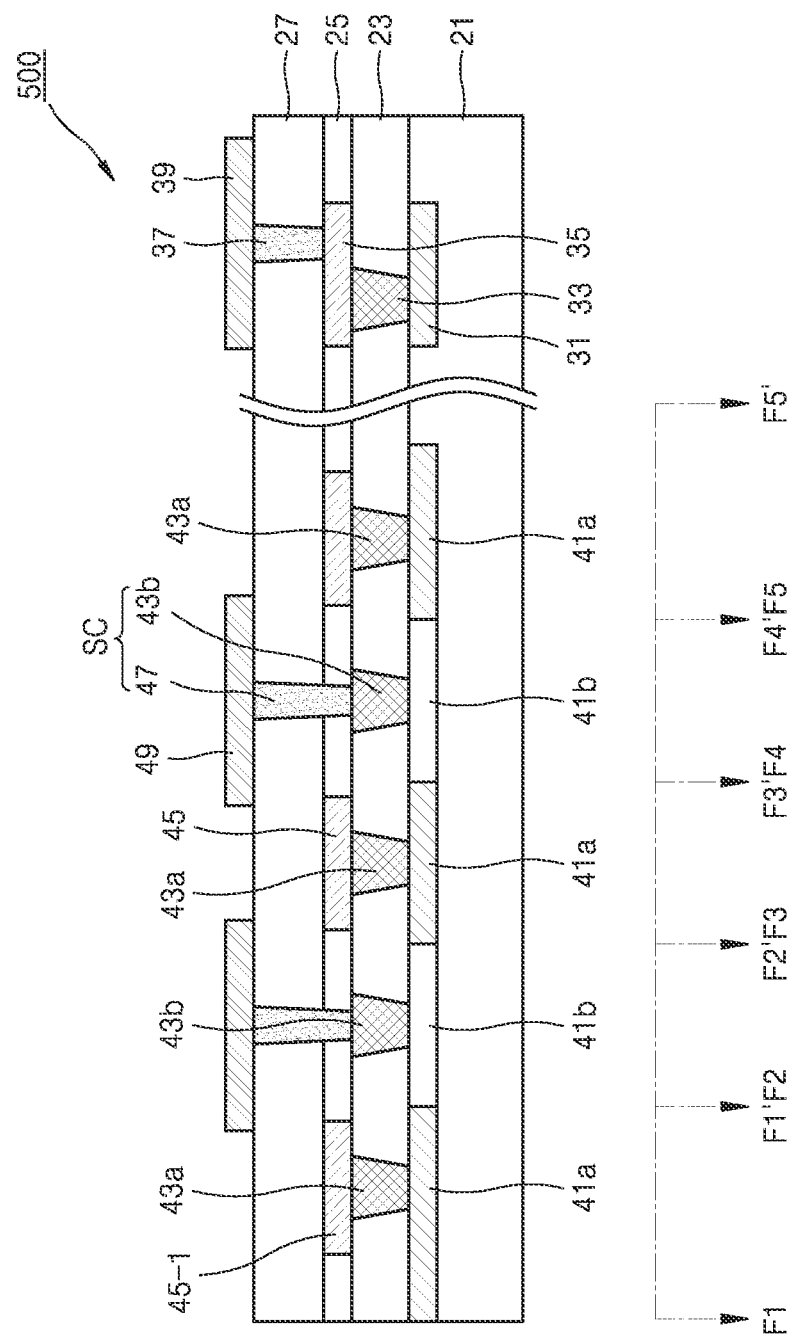
FIG. 5B is a cross-sectional view of elements of the semiconductor device of FIG. 5A, according to various embodiments of the inventive concept.

FIGS. 5A and 5B illustrate the first direction and the second direction as being perpendicular to each other. However, in various embodiments of the inventive concept the first and second directions may not be perpendicular with respect to each other.

FIG. 5B is a cross-sectional view of elements of the semiconductor device 500 of FIG. 5A, according to various embodiments of the inventive concept. FIG. 5B shows sequential cross-sectional views of elements of the semiconductor device 500 of FIG. 5A, respectively taken along lines F1-F1', F2-F2', F3-F3', F4-F4', and F5-F5' of FIG. 5A, and a cross-sectional view of a peripheral interconnection structure formed at the same level as the elements.

The semiconductor device 500 of FIG. 5B is generally similar to the semiconductor device 100 of FIG. 1B, except that a first direction in which the first interconnection 41a and the second interconnection 41b extend is different from a second direction in which the third interconnection 45-1 and the fourth interconnection 49 extend. Thus, FIG. 5B illustrates that there is no distance between the first interconnection 41a and the second interconnection 41b along the first direction, in contrast to the distance BMS between base interconnections 11 as shown in FIGS. 1A and 1B. However, as shown in FIG. 5A, the first interconnection 41a and the second interconnection 41b may extend along the first direction, separate and spaced apart from each other along the second direction.

Figure 6A:
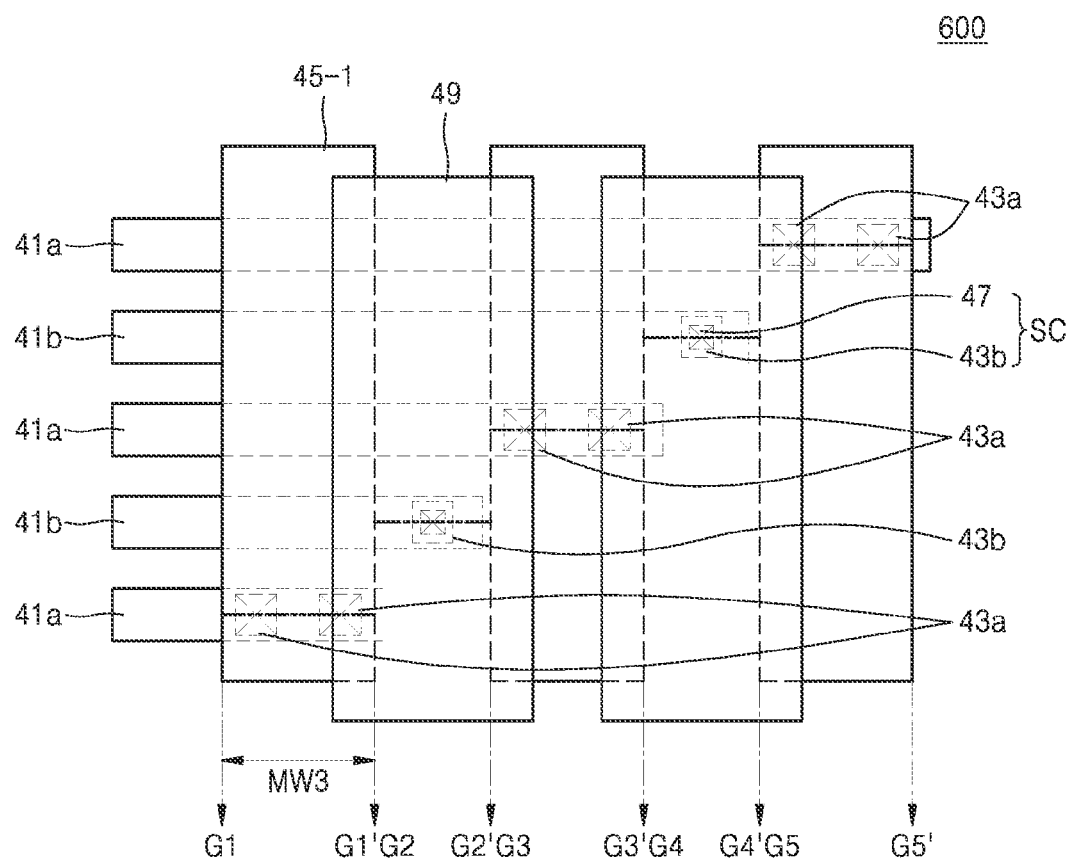
FIG. 6A is a schematic plan layout of a semiconductor device according to various embodiments of the inventive concept.

FIG. 6A is a schematic plan layout of a semiconductor device 600 according to various embodiments of the inventive concept Referring to FIG. 6A, the semiconductor device 600 is similar to the semiconductor device 500 described with reference to FIGS. 5A and 5B, but is however different from the semiconductor device 500 in that a plurality of first contact plugs 43a are formed.

First interconnections 41a and second interconnections 41b disposed on a substrate (not shown) extend in parallel in a first direction (x direction in FIG. 6A), and are alternately formed with respect to each other. Third interconnections 45-1 extend in a second direction (y direction in FIG. 6A), which is different from the first direction, and are connected to the first interconnections 41a by two first contact plugs 43a. In this case, the first contact plugs 43a are sequentially formed in the first direction in which the first interconnections 41a extend, and are connected to the third interconnections 45-1 and separated from each other along a direction (i.e., the first direction) of width MW3 of the third interconnection 45-1. The width MW3 of the third interconnection 45-1 is such a sufficiently great width that each of the two first contact plugs 43a may be connected to the third interconnection 45-1.

Since each of the interconnections must be formed within a predetermined range, it may be difficult to increase the width of each of the interconnections. However, according to various embodiments of the inventive concept, the fourth interconnection 49 to be disposed adjacent to the third interconnection 45-1 may be formed at the second level that is higher than the first level at which the third interconnection 45-1 is formed. Accordingly, the width MW3 of the third interconnection 45-1 may not be restricted by adjacent interconnections. In this case, however, a distance between the third interconnection 45-1 and the stacked contact plug SC disposed adjacent thereto may be restricted within a predetermined range.

Since the width MW3 of the third interconnection 45-1 is sufficiently great, a resistance of the third interconnection 45-1 may be reduced. Also, since the first interconnection 41a and the third interconnection 45-1 are connected by the two first contact plugs 43a, a connection resistance caused by having only a single first contact plug 43a may be reduced. Accordingly, the semiconductor device 600 may be operate more efficiently.

As further shown in FIG. 6A, the fourth interconnection 49 is connected to the second interconnection 41b by the stacked contact plug SC.

FIG. 6B is a cross-sectional view of elements of the semiconductor device 600 of FIG. 6A, according to various embodiments of the inventive concept. FIG. 6B shows sequential cross-sectional views of elements of the semiconductor device 600 of FIG. 6A, respectively taken along lines G1-G1', G2-G2', G3-G3', G4-G4', and G5-G5', and a cross-sectional view of a peripheral interconnection structure formed at the same level as the elements.

Referring to FIG. 6B, two first contact plugs 43a are disposed on the first interconnection 41a to be parallel with each other in a direction of the width MW3 of the third interconnection 45-1, and are connected to the third interconnection 45-1. The width MW3 of the third interconnection 45-1 is such a sufficiently great width that each of the two first contact plugs 43a are connected to the third interconnection 45-1.

Figure 7:
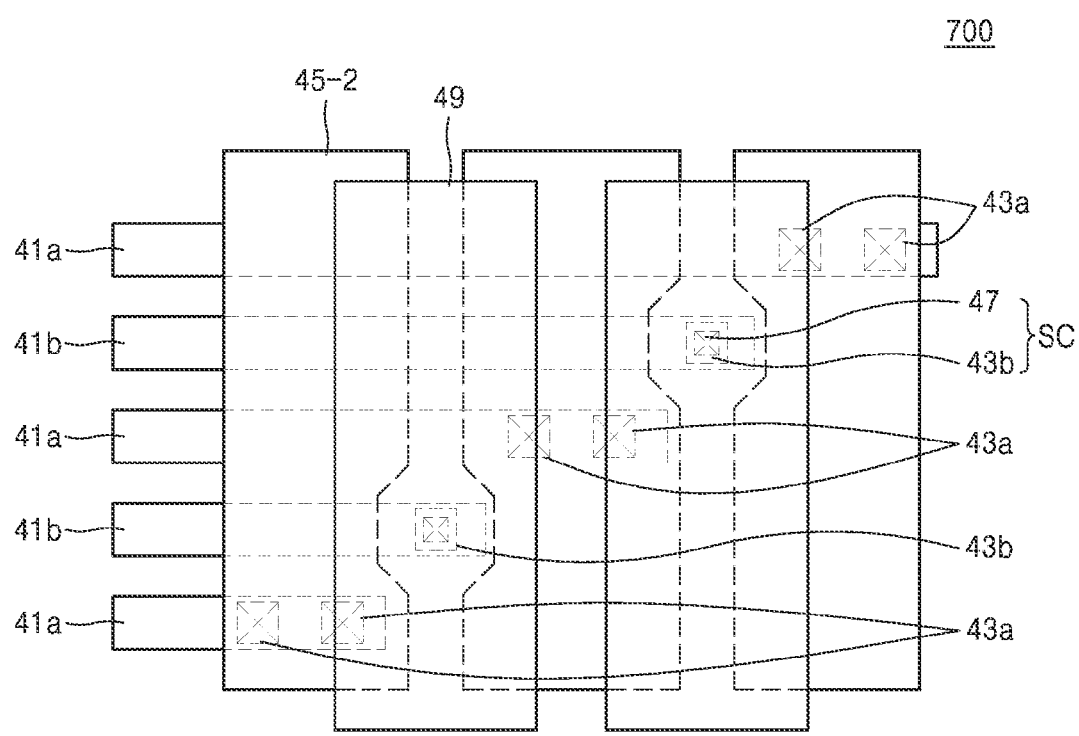
FIG. 7 is a schematic plan layout of a semiconductor device according to various embodiments of the inventive concept.

FIG. 7 is a schematic plan layout of a semiconductor device 700 according to various embodiments of the inventive concept.

Referring to FIG. 7, the semiconductor device 700 is similar to the semiconductor device 500 described with reference to FIGS. 5A and 5B, but is however different from the semiconductor device 500 in that a plurality of first contact plugs 43a are formed and a third interconnection 45-2 has a different structure.

A first interconnection 41a and a third interconnection 45-2 are connected by two first contact plugs 43a so that a connection resistance caused by having only one first contact plug 43a may be reduced, as described above with reference to FIGS. 3A and 3B.

A width of the third interconnections 45-2 is not constant. Two stacked contact plugs SC are shown in FIG. 7 as disposed between the plurality of third interconnections 45-2 which extend in parallel with respect to each other. In this case, a width of the third interconnections 45-2 in the regions where the third interconnections 45-2 are adjacent to the two stacked contact plugs SC may be less than a width of the third interconnections 45-2 in regions where the third interconnections 45-2 are not adjacent to the two stacked contact plugs SC. As a result, the third interconnections 45-2 may be formed separate and away from the two stacked contact plugs SC.

Therefore, the semiconductor devices 100, 200, 300, 400, 500, 600, 700 according to various embodiments of the inventive concept may include an upper interconnection structure in which a plurality of interconnections having similar electrical features may be divided into lower interconnections and upper interconnections. Also, the upper interconnections of the upper interconnection structure are connected to a lower interconnection structure by stacked contact plugs, while the lower interconnections of the upper interconnection structure are connected to the lower interconnection structure by non-stacked contact plugs. As a result, a distance between interconnections, which is determined by process capabilities, may be maintained and a layout region of the interconnections may be reduced, so the volume of the semiconductor devices 100, 200, 300, 400, 500, 600, 700 may be reduced. In addition, since each of the upper interconnections and the lower interconnections may be formed to have a great width, interconnection resistance may be reduced, thereby enabling more efficient operation of the semiconductor devices 100, 200, 300, 400, 500, 600, 700. Furthermore, the occurrence of an electrical short and gap-fill failures may be prevented between the interconnections. Thus, the operating reliability and yield of the semiconductor devices 100, 200, 300, 400, 500, 600, 700 may be improved, and DFM may be enabled.

FIGS. 8A, 8B, 8C and 8D are cross-sectional views of sequential processes of a method of manufacturing a semiconductor device 100, according to various embodiments of the inventive concept.

Referring to FIG. 8A, a conductive material may be formed on a substrate 20, and a photolithography process and an etching process may be performed to form base interconnections 11. In this case, a first peripheral interconnection 31 of a peripheral interconnection structure may be formed together with the base interconnections 11. Subsequently, a first insulating layer 21 may be formed between the base interconnections 11 to electrically insulate the base interconnections 11 from one another.

In various embodiments, the substrate 20 may be a semiconductor wafer. In various embodiments, the substrate 20 may include silicon (Si). In various other embodiments, the substrate 20 may include a semiconductor element, such as germanium (Ge), or a semiconductor compound, such as silicon carbide (SiC), gallium arsenide (GaAs), indium arsenide (InAs), and indium phosphide (InP). In at least one embodiment, the substrate 20 may have a silicon-on-insulator (SOI) structure. For example, the substrate 20 may include a buried oxide (BOX) layer. In various embodiments, the substrate 20 may include a conductive region, for example, a doped well or a doped structure. Also, the substrate 20 may have various isolation structures, such as a shallow trench isolation (STI) structures.

A plurality of individual devices of various types may be formed on the substrate 20. The plurality of individual devices may include various microelectronic devices, for example, a metal-oxide-semiconductor field-effect transistor (MOSFET), a system large-scale integration (system LSI), an image sensor such as a complementary metal-oxide-semiconductor (CMOS) imaging sensor (CIS), a micro-electro-mechanical system (MEMS), an active device, and a passive device. The plurality of individual devices may be electrically connected to an active region (not shown) of the substrate 20. Also, each of the plurality of individual devices may be electrically isolated from other adjacent individual devices by insulating structures (not shown).

Although FIG. 8A illustrates the substrate 20 as a single layer, in various embodiments the substrate 20 may have a stack structure of a plurality of layers. Also, although not shown, various devices or interconnections may be formed on the substrate 20.

Figure 8B:
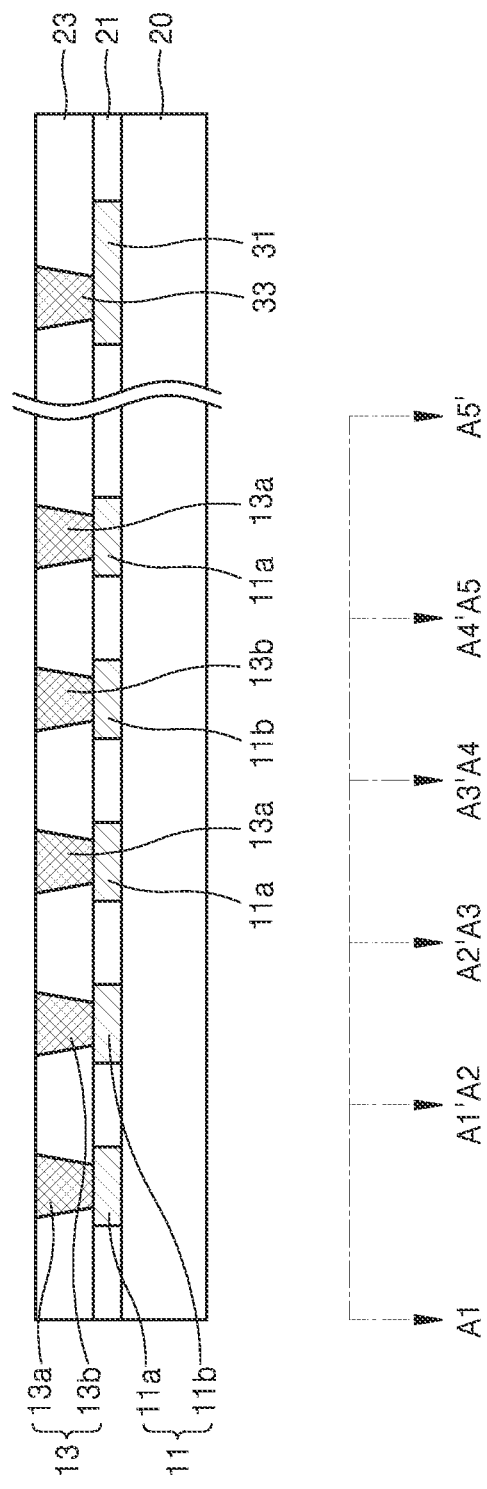

Referring to FIG. 8B, a second insulating layer 23 may be formed to cover the first insulating layer 21, the base interconnections 11 and the first peripheral interconnection 31. A portion of the second insulating layer 23 may be etched, thereby forming first contact holes and second contact holes exposing the base interconnections 11. In this case, a fourth contact hole may be formed in the peripheral interconnection structure during the formation of the first and second contact holes. The first contact holes, the second contact holes, and the fourth contact hole may be filled with a conductive material, thereby forming first contact plugs 13a, second contact plugs 13b, and a fourth contact plug 33.

FIGS. 8A and 8B illustrate an example in which the first insulating layer 21 and the second insulating layer 23 are separately formed. In various embodiments, an insulating layer may be formed on the substrate 20 as having such a thickness so that the first insulating layer 21 and the second insulating layer 23 may be formed at the same time. Thus, the first insulating layer 21 and the second insulating layer 23 may be formed of the same material.

Referring to FIG. 8C, a conductive material may be formed to cover the second insulating layer 23, the first contact plugs 13a, the second contact plugs 13b, and the fourth contact plug 33. Thereafter, the conductive material may be patterned, thereby forming third interconnections 15-1 and a second peripheral interconnection 35. The third interconnections 15-1 may be connected to the first contact plugs 13a, and the second peripheral interconnection 35 may be connected to the fourth contact plug 33 of the peripheral interconnection structure. In this case, the third interconnections 15-1 and the second peripheral interconnection 35 may be formed by performing a dry etching process using a reactive ion etching (RIE) method. Subsequently, a third insulating layer 25 may be formed between the third interconnections 15-1 and the second peripheral interconnection 35 so that the third interconnections 15-1 and the second peripheral interconnection 35 may be electrically insulated from one another.

Referring to FIG. 8D, a fourth insulating layer 27 may be formed on the third insulating layer 25, the third interconnections 15-1, and the second peripheral interconnection 35. Portions of the third insulating layer 25 and portions of the fourth insulating layer 27 may be etched to form third contact holes exposing top surfaces of the second contact plugs 13b. Simultaneously, a portion of the fourth insulating layer 27 may be etched in a peripheral interconnection structure to form a fifth contact hole exposing a top surface of the second peripheral interconnection 35. The third contact holes and the fifth contact hole may be filled with a conductive material, thereby forming third contact plugs 17 and a fifth contact plug 37. Thus, the third contact plugs 17 connected to the second contact plugs 13b may constitute stacked contact plugs.

Although FIGS. 8C and 8D illustrate the third insulating layer 25 and the fourth insulating layer 27 as being formed separately, an insulating layer may be formed on the second insulating layer 23 as having such a thickness so that the third insulating layer 25 and the fourth insulating layer 27 may be formed at the same time. Thus, the third insulating layer 25 and the fourth insulating layer 27 may be formed of the same material.

Thereafter, referring back to FIG. 1B, a conductive material may be formed to cover the fourth insulating layer 27, the third contact plugs 17, and the fifth contact plug 37. Thereafter, the conductive material may be patterned, thereby forming fourth interconnections 19 and a third peripheral interconnection 39. The fourth interconnections 19 may be connected to the third contact plugs 17, and the third peripheral interconnection 39 may be connected to the fifth contact plug 37 of the peripheral interconnection structure. As a result, the semiconductor device 100 of FIG. 1B may be formed. In this case, the fourth interconnections 19 and the third peripheral interconnections 39 may be formed by performing a dry etching process using an RIE method.

In various embodiments, the base interconnections 11, the third interconnections 15-1, the fourth interconnections 19, the second peripheral interconnection 35, and the third peripheral interconnection 39 may be formed using a damascene process. Thus, the first insulating layer 21 may be formed on the substrate 20 and etched to form a pattern defining the base interconnections 11 and the first peripheral interconnection 31. The etched portion of the first insulating layer 21 may be filled with a conductive material, and an etchback process, for example, a chemical mechanical polishing (CMP) process, may be performed to form the base interconnections 11 and the first peripheral interconnection 31.

The third interconnections 15-1, the fourth interconnections 19, the second peripheral interconnection 35, and the third peripheral interconnection 39 may also be formed using a damascene process similar to the method of forming the base interconnections 11 and the first peripheral interconnection 31 described above.

In various embodiments, the base interconnections 11, the third interconnections 15-1, the fourth interconnections 19, the second peripheral interconnection 35, and the third peripheral interconnection 39, which are included in the semiconductor device 100 and formed using the damascene process, may include copper (Cu).

The base interconnections 11, the first contact plugs 13a, the second contact plugs 13b, the third contact plugs 17, the fourth contact plug 33, the fifth contact plug 37, the third interconnections 15-1, the fourth interconnections 19, and the second peripheral interconnection 35 may include a conductive material.

In various embodiments, the conductive material may include a single layer or a multilayered structure including at least one selected from the group consisting of tungsten (W), tungsten nitride (WN), tungsten carbide (WC), copper (Cu), copper tin (CuSn), copper magnesium (CuMg), copper nickel (CuNi), copper zinc (CuZn), copper palladium (CuPd), copper gold (CuAu), copper rhenium (CuRe), copper tungsten (CuW), titanium (Ti), titanium nitride (TiN), tantalum (Ta), tantalum nitride (TaN), ruthenium (Ru), cobalt (Co), manganese (Mn), tungsten nitride (WN), nickel (Ni), or nickel boron (NiB) or an alloy thereof, but the inventive concept is not limited thereto.

In various embodiments, the third interconnections 15-1 and the fourth interconnections 19 may have a stack structure of a plurality of different metal materials. For example, the third interconnections 15-1 and the fourth interconnections 19 may have a stack structure including aluminum (Al), titanium (Ti), and titanium (TiN). In various embodiments, the third interconnections 15-1 and the fourth interconnections 19 may have a stack structure including copper (Cu), titanium (Ti), and titanium nitride (TiN).

In various embodiments, the first contact plugs 13a, the second contact plugs 13b, the third contact plugs 17, the fourth contact plug 33, and the fifth contact plug 37 may include tungsten (W). In various embodiments, the third interconnections 15-1 and the fourth interconnections 19, each of which having the stack structure of the plurality of metal materials, may have a thickness of about 10 Å to about 50000 Å.

In various embodiments, the first, second, third, and fourth insulating layers 21, 23, 25, and 27 may include an oxide layer, a nitride layer, a carbide layer, a polymer, or a combination thereof, although various other material layers may be included.

Figure 9:
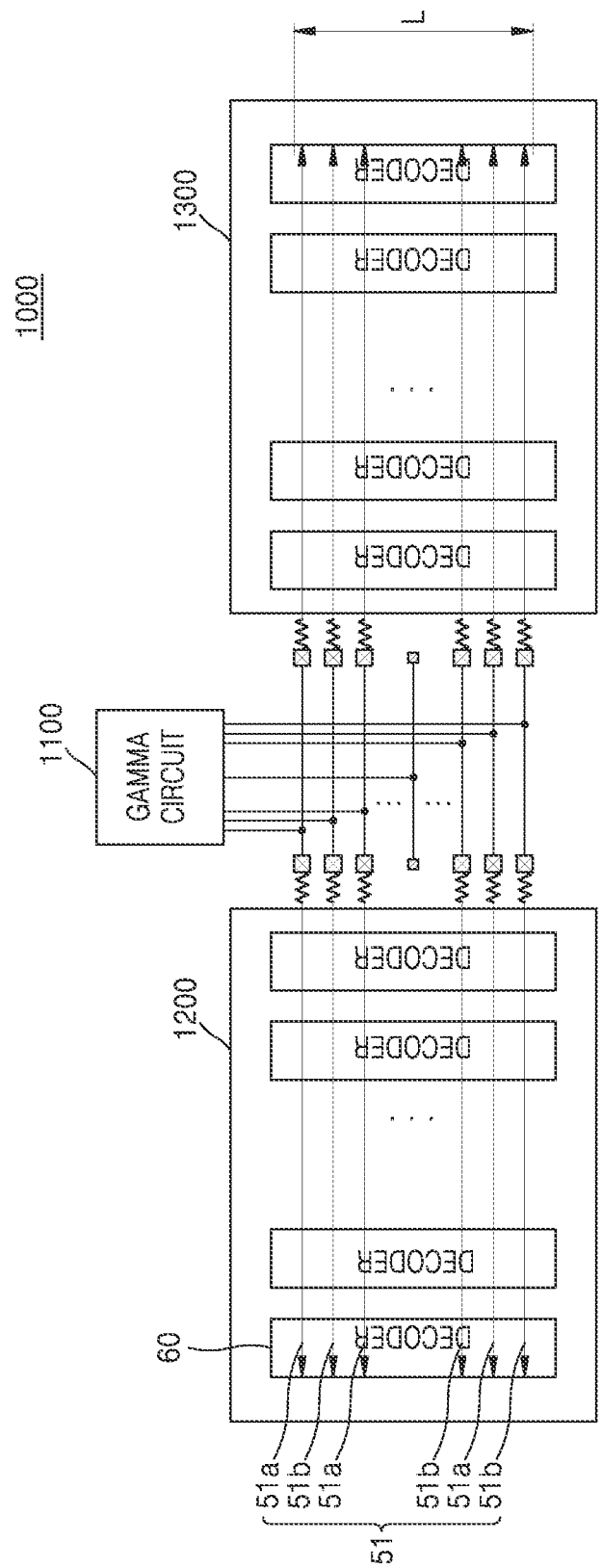
FIG. 9 is a schematic diagram of a display driver integrated circuit (IC) including a semiconductor device according to various embodiments of the inventive concept.

FIG. 9 is a schematic diagram of a DDI 1000 including a semiconductor device according to various embodiments of the inventive concept.

Referring to FIG. 9, the DDI 1000 includes a gamma circuit unit 1100 formed on the substrate of FIG. 1A, and source drivers 1200 and 1300 formed on the substrate and including a plurality of decoders 60 configured to decode a data signal transmitted by the gamma circuit unit 1100. A plurality of interconnections 51 connected between the gamma circuit unit 1100 and the plurality of decoders 60 include a plurality of third interconnections 51a which extend at a first level on the substrate, and a plurality of fourth interconnections 51b which alternate with the plurality of third interconnections 51a and extend at a second level that is higher than the first level. The plurality of third interconnections 51a are respectively connected to the plurality of first interconnections 11a of FIG. 1A, which are formed at a lower level than the first level, by the plurality of first contact plugs 13a of FIG. 1A. The plurality of fourth interconnections 51b are respectively connected to the plurality of second interconnections 11b of FIG. 1A, which are formed at a lower level than the first level, by stacked contact plugs SC. The stacked contact plugs include the second contact plugs 13b of FIG. 1A and the third contact plugs 17 of FIG. 1A. The second contact plugs 13b are connected to top surfaces of the second interconnections 11b. Also, the third contact plugs 17 of FIG. 1A are connected to top surfaces of the second contact plugs 13b and bottom surfaces of the fourth interconnections 51b. Therefore, in the interconnection structure included in the semiconductor device according to various embodiments of the inventive concept, an interconnection layout L of a plurality of interconnections as shown in FIG. 9 may be reduced while maintaining a distance between the interconnections, so that a volume of the semiconductor device may be reduced.

The third interconnections 51a and the fourth interconnections 51b respectively include the third interconnections 15-1, 15-2, 15-3, 45-1, and 45-2, and the fourth interconnections 19 and 49, which are included in the semiconductor devices 100, 200, 300, 400, 500, 600, and 700 described with reference to FIGS. 1A to 7. Different voltages may be applied to the plurality of third interconnections 51a and the plurality of fourth interconnections 51b, respectively. In various embodiments, each of lengths of the third interconnections 51a and lengths of the fourth interconnections 51b may range from about 10 μm to about 30000 μm. In various embodiments, a length of the third interconnections 51a may be substantially equal to a length of the fourth interconnections 51b.

Figure 10:
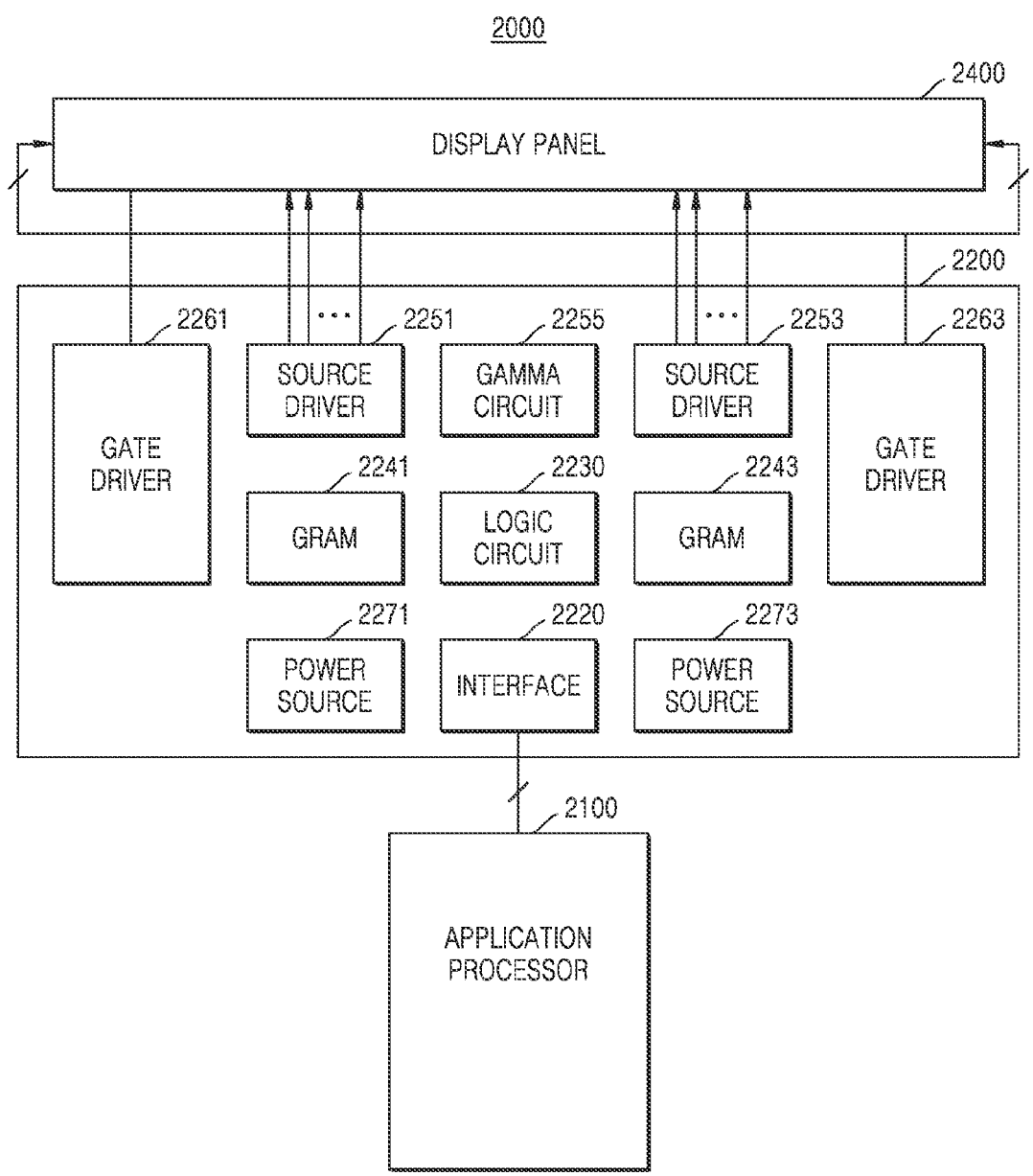
FIG. 10 is a schematic block diagram of a display device according to various embodiments of the inventive concept.

FIG. 10 is a block diagram of a display device 2000 according to various embodiments of the inventive concept.

Referring to FIG. 10, the display device 2000 includes an application processor (AP) 2100, a DDI 2200, and a display panel 2400.

The DDI 2200 may display display data on the display panel 2400 under the control of a processor, for example, the AP 2100. When the DDI 2200 is used in a mobile device, the DDI 2200 may be called a mobile DDI. The DDI 2200 may be the display driver 1000 of FIG. 9.

The DDI 2200 includes a serial interface 2220, a logic circuit 2230, and at least one graphic RAM (GRAM), for example, GRAMs 2241 and 2243. The serial interface 2220 of the DDI 2200 performs serial communication with a serial interface (not shown) of the AP 2100.

The GRAMs 2241 and 2243 may process image data or graphic data to be displayed on the display panel 2400. Although not shown, in various embodiments, the GRAMs 2241 and 2243 may be replaced by line buffers.

The DDI 2200 further includes at least one source driver (e.g., source drivers 2251 and 2253), a gamma circuit 2255, at least one gate driver (e.g., gate drivers 2261 and 2263), and at least one power source (e.g., power sources 2271 and 2273). FIG. 10 illustrates an example in which the DDI 2200 includes two source drivers 2251 and 2253, one gamma circuit 2255, two gate drivers 2261 and 2263, and two power sources 2271 and 2273, although in various embodiments not all of the above noted elements and/or additional elements may be included in DDI 2200.

The source drivers 2251 and 2253 may provide signals corresponding to image data or graphic data output by the GRAMs 2241 and 2243 to data lines of the display panel 2400 by using the corresponding gamma voltages output by the gamma circuit 2255. The gamma voltages that are output by the gamma circuit 2255 and transmitted to the source drivers 2251 and 2253 may be transmitted through the third interconnections 15-1, 15-2, 15-3, 45-1, and 45-2 and the fourth interconnections 19 and 49, which are included in the semiconductor devices 100, 200, 300, 400, 500, 600, and 700 described with reference to FIGS. 1A to 7. The gate drivers 2261 and 2263 may drive gate lines of the display panel 2400. For example, since pixels of the display panel 2400 are operated under the control of the source drivers 2251 and 2253 and the gate drivers 2261 and 2263, images corresponding to the image data or the graphic data output by the GRAMs 2241 and 2243 may be displayed on the display panel 2400.

The two power sources 2271 and 2273 may supply required power to the elements 2230, 2220, 2241, 2243, 2251, 2253, 2255, 2261, and 2263 of the DDI 2200 and the display panel 2400.

Figure 11:
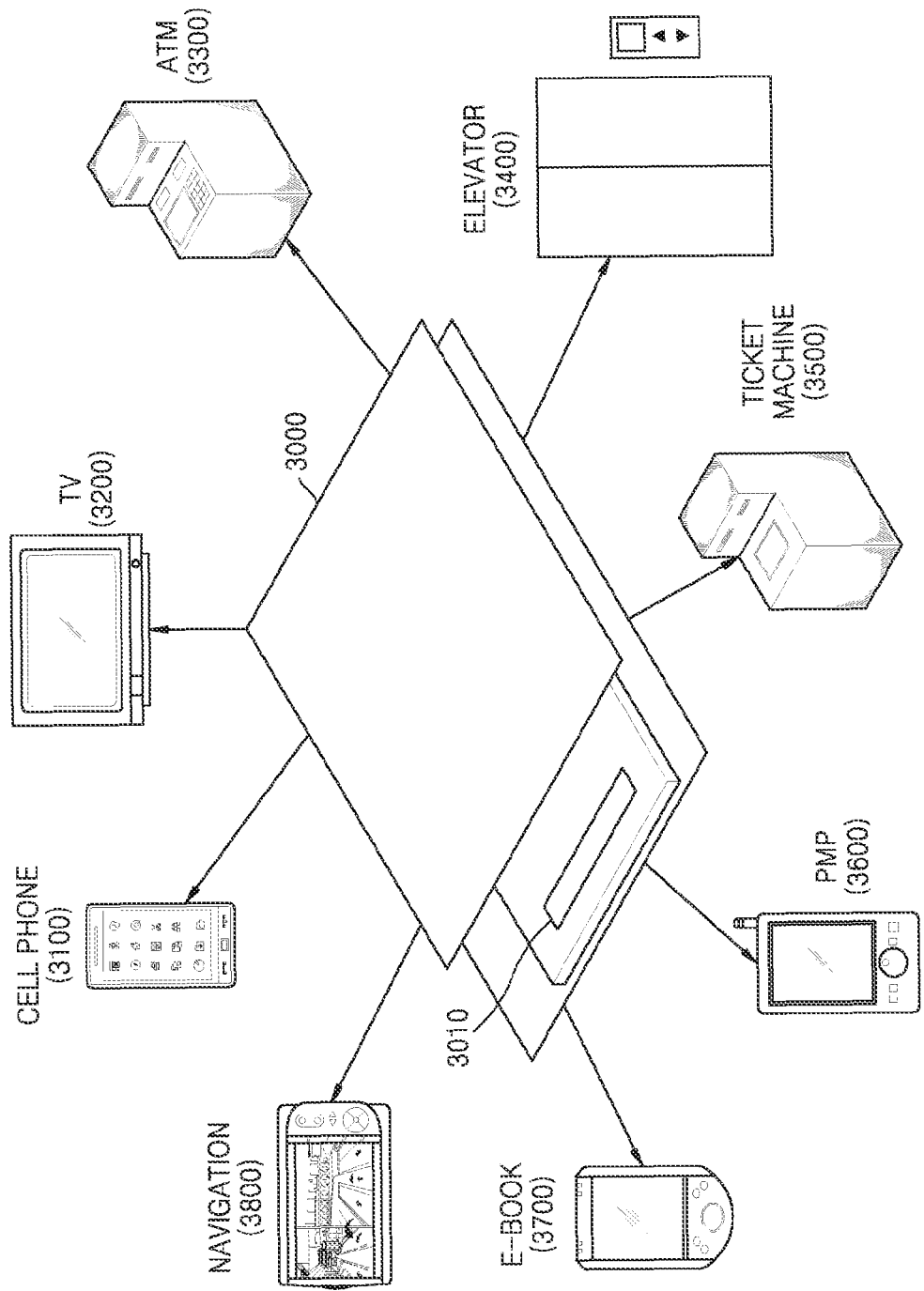
FIG. 11 is a diagram of various applied examples of electronic products in which a display device according to various embodiments of the inventive concept is mounted.

FIG. 11 is a diagram of various application examples of electronic products in which a display device 3000 according to various embodiments of the inventive concept may be mounted.

Referring to FIG. 11, the semiconductor devices 100, 200, 300, 400, 500, 600, and 700 described with reference to FIGS. 1A to 7, the DDI 1000 of FIG. 9, and the display device 2000 of FIG. 10 may be broadly applied to electronic products, for example, not only a cell phone 3100 but also to a TV 3200, an automated teller machine (ATM) 3300 configured to perform bank deposits or withdrawals, an elevator 3400, a ticket machine 3500 used at subway stations, a portable media player (PMP) 3600, an electronic book (e-book) 3700, a navigation system 3800, among other electronic products.

Each of the semiconductor devices 100, 200, 300, 400, 500, 600, and 700 included in the display device 3000, the DDI 1000 of FIG. 9, and the display device 2000 of FIG. 10 may include an interconnection structure in which a plurality of interconnections are divided into upper interconnections and lower interconnections and the upper interconnections are connected by stacked contact plugs. As a result, a distance between interconnections, which is determined by process capability, may be maintained and a layout region of the interconnections may be reduced, so that the volume of the semiconductor devices may be reduced. Furthermore, an appropriate interconnection resistance may be ensured, thereby enabling fabrication of high-speed, downscaled semiconductor devices.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
a plurality of first interconnections and a plurality of second interconnections extending on a substrate, the first interconnections and the second interconnections being alternately disposed with respect to each other as viewed in a direction perpendicular to the substrate;
a plurality of third interconnections extending along a first planar surface at a first level higher than a level at which the first interconnections and the second interconnections are disposed;
a plurality of fourth interconnections extending along a second planar surface parallel to said first planar surface and situated at a second level that is higher than the first level;
a plurality of first contact plugs, the first contact plugs extending vertically between and connecting the first and the third interconnections to each other; and
a plurality of stacked contact plugs connecting the second and the fourth interconnections to each other, each of the stacked contact plugs including a second contact plug and a third contact plug,
wherein the second contact plug extends vertically upwardly from a respective one of the second interconnections so as to be connected to said one of the second interconnections, and the third contact plug extends vertically downwardly from a respective one of the fourth interconnections so as to be connected to said one of the fourth interconnections,
the second contact plug has a top surface, the third contact plug has a bottom surface, and the area of the top surface of the second contact plug is at least equal to the area of the bottom surface of the third contact plug,
the top and the bottom surfaces meet to form an interface at which the third contact plug is stacked directly on the second contact plug such that the third contact plug extends vertically between and connects the second contact plug and the respective one of the fourth interconnections to each other,
the interface is coplanar with said first planar surface,
the third and the fourth interconnections extend parallel to each other and are disposed alternately with respect to each other as viewed in the direction perpendicular to the substrate, and
a width of each of the fourth interconnections is the same or greater than a distance between adjacent ones of the third interconnections in a common direction parallel to said planar surfaces.

2. The device of claim 1, wherein a width of the top surface of the second contact plug is greater than a width of the third contact plug in a common direction parallel to said planar surfaces.

3. The device of claim 1, wherein widths of the third interconnections and the fourth interconnections are each greater than any of the widths of the first interconnections and the second interconnections.

4. The device of claim 1, wherein the third and fourth interconnections comprise strips of conductive material, respectively, extending longitudinally parallel to each other, and each of the third interconnections overlaps adjacent ones of the fourth interconnections in a as viewed in the direction perpendicular to a main surface of the substrate.

5. The device of claim 1, wherein each of the third interconnections has varying width, wherein a first width of a region of the third interconnection that is adjacent to one of the stacked contact plugs is less than a second width of a region of the third interconnection that is not adjacent to the stacked contact plug.

6. The device of claim 1, wherein each of the stacked contact plugs is interposed between adjacent ones of a respective pair of the third interconnections.

7. The device of claim 1, wherein a first distance between each of the stacked contact plugs and a respective one of third interconnections that is adjacent to a first side of the stacked contact plug is substantially equal to a second distance between the stacked contact plug and another of the third interconnections that is adjacent to a second side of the stacked contact plug.

8. The device of claim 1, wherein a respective group of the first contact plugs extends vertically between and connects each of the first interconnections and a respective one of the third interconnections to each other.

9. The device of claim 1, wherein a respective group of the stacked contact plugs connects each of the second interconnections and a respective one of fourth interconnections to each other.

10. The device of claim 1, wherein the first, second, third, and fourth interconnections extend parallel with respect to each other.

11. The device of claim 1, wherein the first and the second interconnections extend parallel with respect to each other in a first direction, and the third interconnections and the fourth interconnections extend parallel with respect to each other in a second direction that is different from the first direction.

12. The device of claim 11, wherein a respective group of the first contact plugs connects each of the first interconnections and one of the third interconnections to each other, and the first contact plugs of the group are aligned with each other in the first direction.

13. The device of claim 1, wherein each of the third interconnections has uniform width.

14. A display driver integrated circuit (IC) comprising:
a gamma circuit configured to generate a plurality of gamma voltages; and
a source driver including a plurality of decoders configured to select and output any one of the plurality of gamma voltages generated by the gamma circuit through a plurality of third interconnections and a plurality of fourth interconnections,
wherein the plurality of third interconnections extend over a substrate at a first level and are respectively connected at bottom surfaces thereof to a plurality of first interconnections, disposed at a lower level than the first level, by a plurality of first contact plugs,
the plurality of fourth interconnections extend over the substrate at a second level that is higher than the first level and are respectively connected to a plurality of second interconnections disposed at a lower level than the first level by stacked contact plugs including a plurality of second contact plugs and a plurality of third contact plugs,
each of the second contact plugs extends vertically upwardly from a respective one of the second interconnections so as to be connected to said respective one of the second interconnections, and each of the third contact plugs extends vertically downwardly from a respective one of the third interconnections so as to be connected to said respective one of the third interconnections,
each of the second contact plugs has a top surface, each of the third contact plugs has a bottom surface, the top and the bottom surfaces of respective ones of the second and third contact plugs meet to form an interface at which the respective third contact plug is stacked directly on the respective second contact plug such that the respective third contact plug extends vertically between and connects a respective one of the second contact plugs and a respective one of the fourth interconnections to each other, the interface being coplanar with the bottom surfaces of the third interconnections, the area of the top surface of each of the second contact plugs is at least equal to the area of the bottom surface of the third contact plug stacked directly thereon, and the third interconnections and the fourth interconnections extend longitudinally parallel to each other and are alternately disposed with respect to each other as viewed in a direction perpendicular to a main surface of the substrate, and a width of each of the fourth interconnections is the same as or greater than a distance between adjacent ones of the third interconnections.

15. The display driver IC of claim 14, wherein different voltages are respectively applied to the plurality of third interconnections and the plurality of fourth interconnections.

16. A semiconductor device comprising:

a plurality of first and second interconnections disposed over a substrate;

a plurality of third interconnections disposed at a first level above the plurality of first interconnections; and a plurality of fourth interconnections disposed at a second level above the first level, wherein the first interconnections and the third interconnections are connected to each other by first contact plugs, and the second interconnections and the fourth interconnections are connected to each other by stacked contact plugs, each of the interconnections comprises a strip of conductive material such that each of the interconnections has a respective length and a width less than its length, the third and fourth interconnections extend parallel to each other in directions of their lengths, and are disposed alternately with respect to each other in directions of their widths as viewed in a direction perpendicular to a main surface of the substrate, the widths of the third and fourth interconnections are each greater than any of the widths of the first and second interconnections, each of the stacked contact plugs comprises a second contact plug connected to a respective second interconnection from among the plurality of second interconnections, and a third contact plug connected to the second contact plug and a respective fourth interconnection from among the plurality of fourth interconnections, each of the second contact plugs has a top surface, each of the third contact plugs has a bottom surface, the top and the bottom surfaces of respective ones of the second and third contact plugs meet to form an interface at which the respective third contact plug is stacked directly on the respective second contact plug such that the respective third contact plug extends vertically between and connects the respective second contact plugs and the respective fourth interconnections to each other, the interface being coplanar with bottom surfaces of the third interconnections, the area of the top surface of each of the second contact plugs is at least equal to the area of the bottom surface of the third contact plug stacked directly thereon, and a width of each of the fourth interconnections is the same as or greater than a distance between adjacent ones of the third interconnections.

17. The semiconductor device of claim 16, wherein the fourth interconnections overlap the third interconnections in directions of their widths as viewed in a direction perpendicular to a main surface of the substrate.

18. The semiconductor device of claim 16, wherein each of the stacked contact plugs is disposed between adjacent ones of a respective pair of the third interconnections, and each of the third interconnections has a varying width, and a first width of each of regions of the third interconnections that are adjacent to the stacked contact plugs is less than a second width of each of regions of the third interconnections that are not adjacent to the stacked contact plugs, and the second width of each of the regions of the third interconnections is greater than any of the widths of the first and second interconnections.

* * * * *